(12) United States Patent
Hirler

(10) Patent No.: US 8,022,470 B2
(45) Date of Patent: Sep. 20, 2011

(54) SEMICONDUCTOR DEVICE WITH A TRENCH GATE STRUCTURE AND METHOD FOR THE PRODUCTION THEREOF

(75) Inventor: Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 344 days.

(21) Appl. No.: 12/204,665

(22) Filed: Sep. 4, 2008

(65) Prior Publication Data
US 2010/0052044 A1    Mar. 4, 2010

(51) Int. Cl.
*H01L 29/78* (2006.01)
(52) U.S. Cl. ........ 257/328; 257/329; 257/330; 257/341; 257/E29.262; 438/259; 438/270
(58) Field of Classification Search .................. 257/328, 257/E29.262, 302, 330, 343, 339, 341; 438/259, 438/270, 271, 589
See application file for complete search history.

(56) References Cited

U.S. PATENT DOCUMENTS

| | | | | |
|---|---|---|---|---|
| 5,378,911 A | * | 1/1995 | Murakami | 257/334 |
| 5,801,408 A | * | 9/1998 | Takahashi | 257/212 |
| 6,051,488 A | * | 4/2000 | Lee et al. | 438/589 |
| 2004/0089910 A1 | * | 5/2004 | Hirler et al. | 257/500 |
| 2004/0113202 A1 | * | 6/2004 | Kocon et al. | 257/330 |
| 2005/0082591 A1 | * | 4/2005 | Hirler et al. | 257/302 |

* cited by examiner

*Primary Examiner* — Thinh Nguyen
(74) *Attorney, Agent, or Firm* — Dicke, Billig & Czaja, PLLC

(57) ABSTRACT

A semiconductor device with a trench gate structure includes a semiconductor body with switching electrodes. At least gate electrode controls the off state and the on state between the switching electrodes. The at least one gate electrode in the trench gate structure controls at least one vertical switching channel through at least one body zone. The trench gate structure includes at least one trench with side walls, wherein the at least one gate electrode, which is insulated against the side walls in the region of the at least one body zone alternately by at least one gate oxide section and at least one trench oxide section and forms a switching channel with a gate oxide section in the at least one region, is located in the at least one trench.

23 Claims, 18 Drawing Sheets

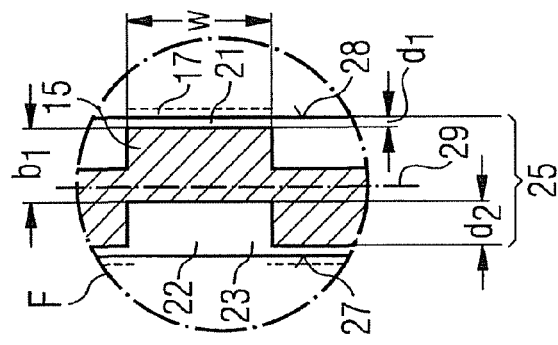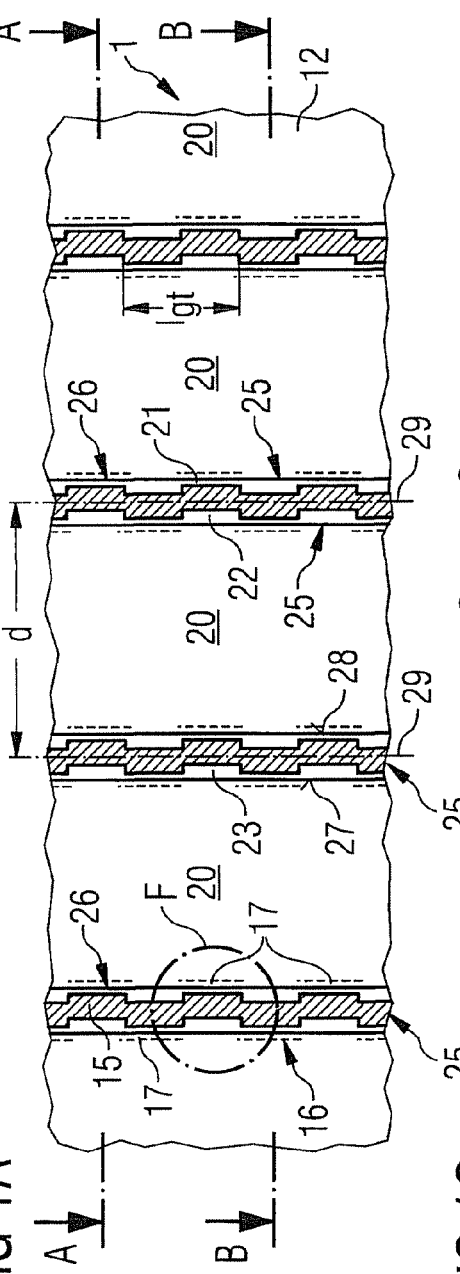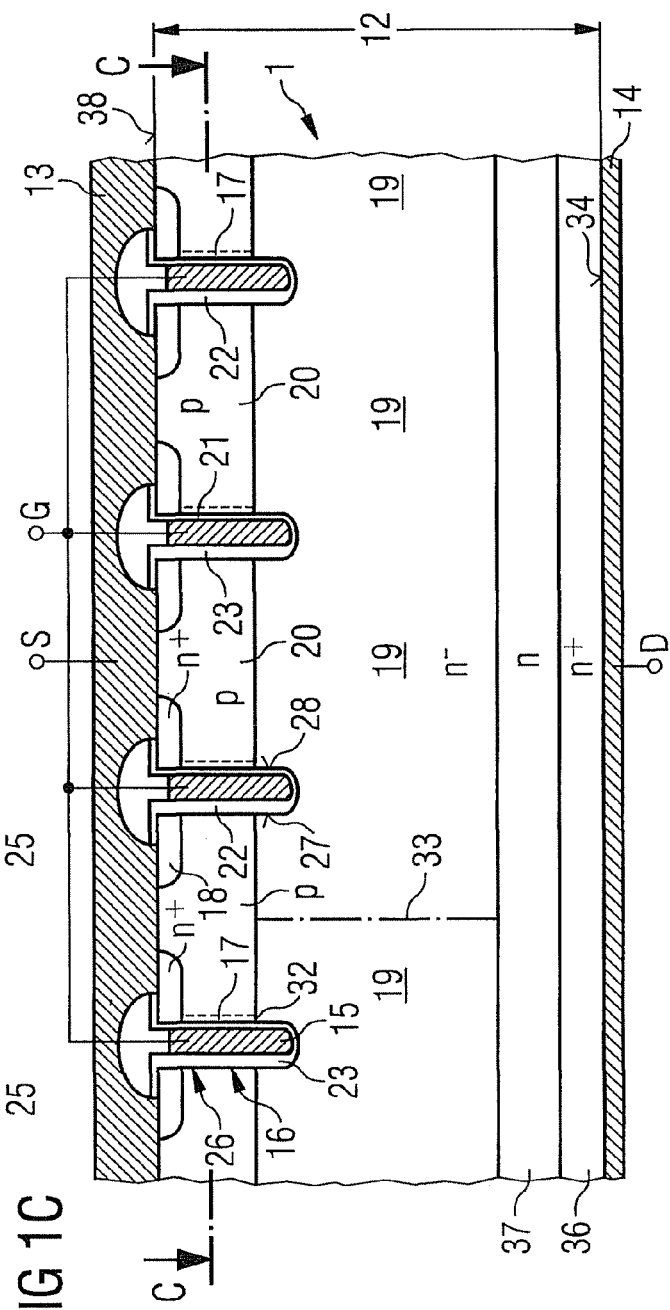

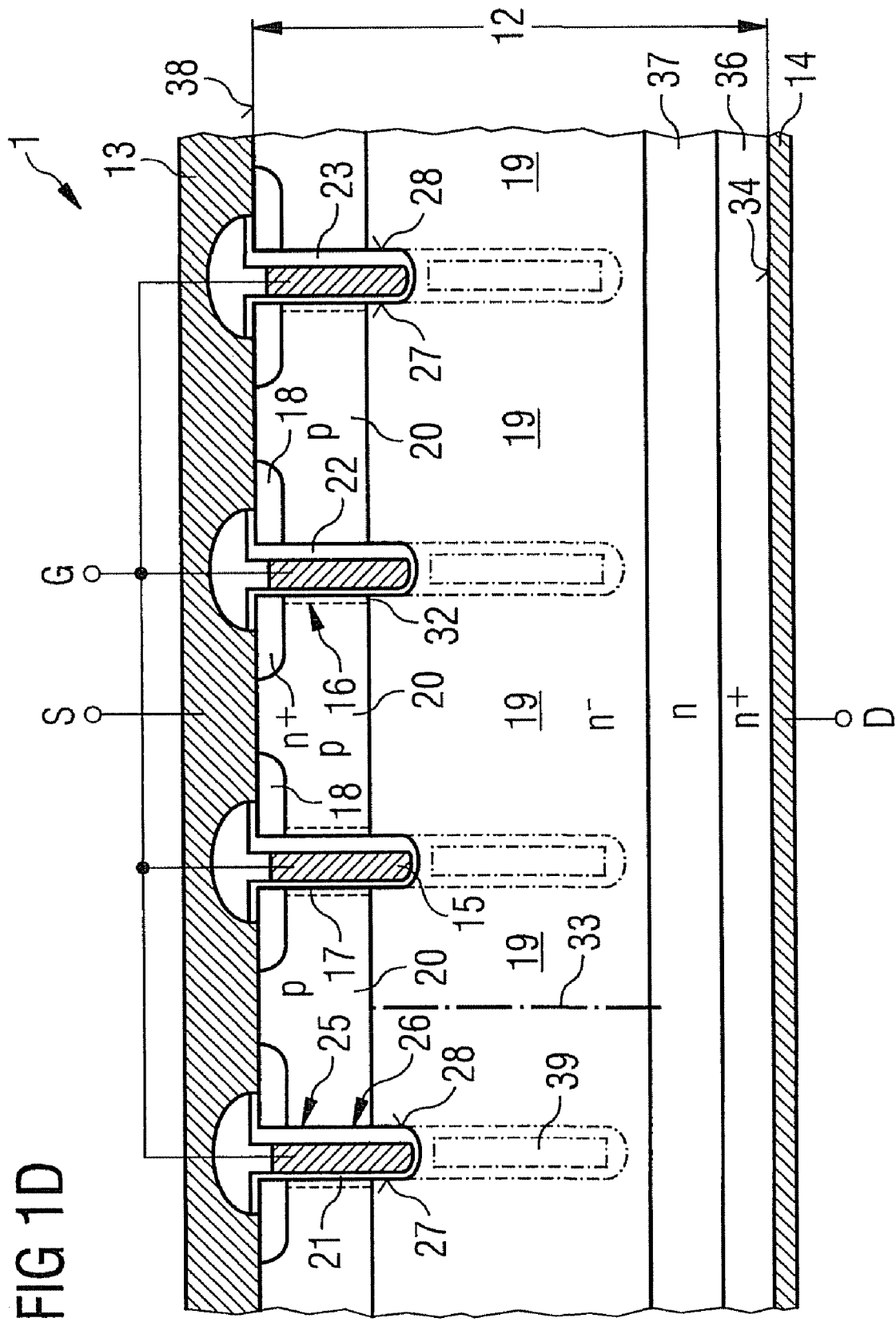

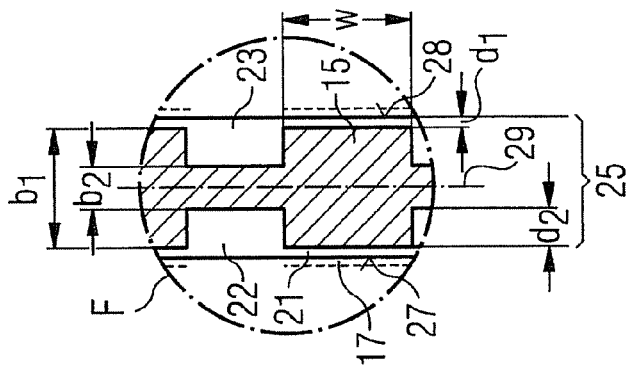
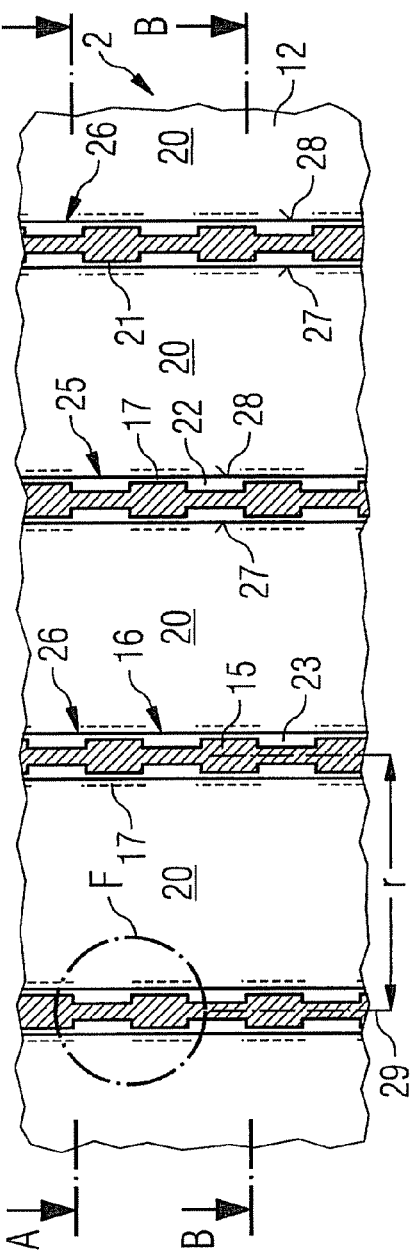
FIG 2B
FIG 2A
FIG 2C

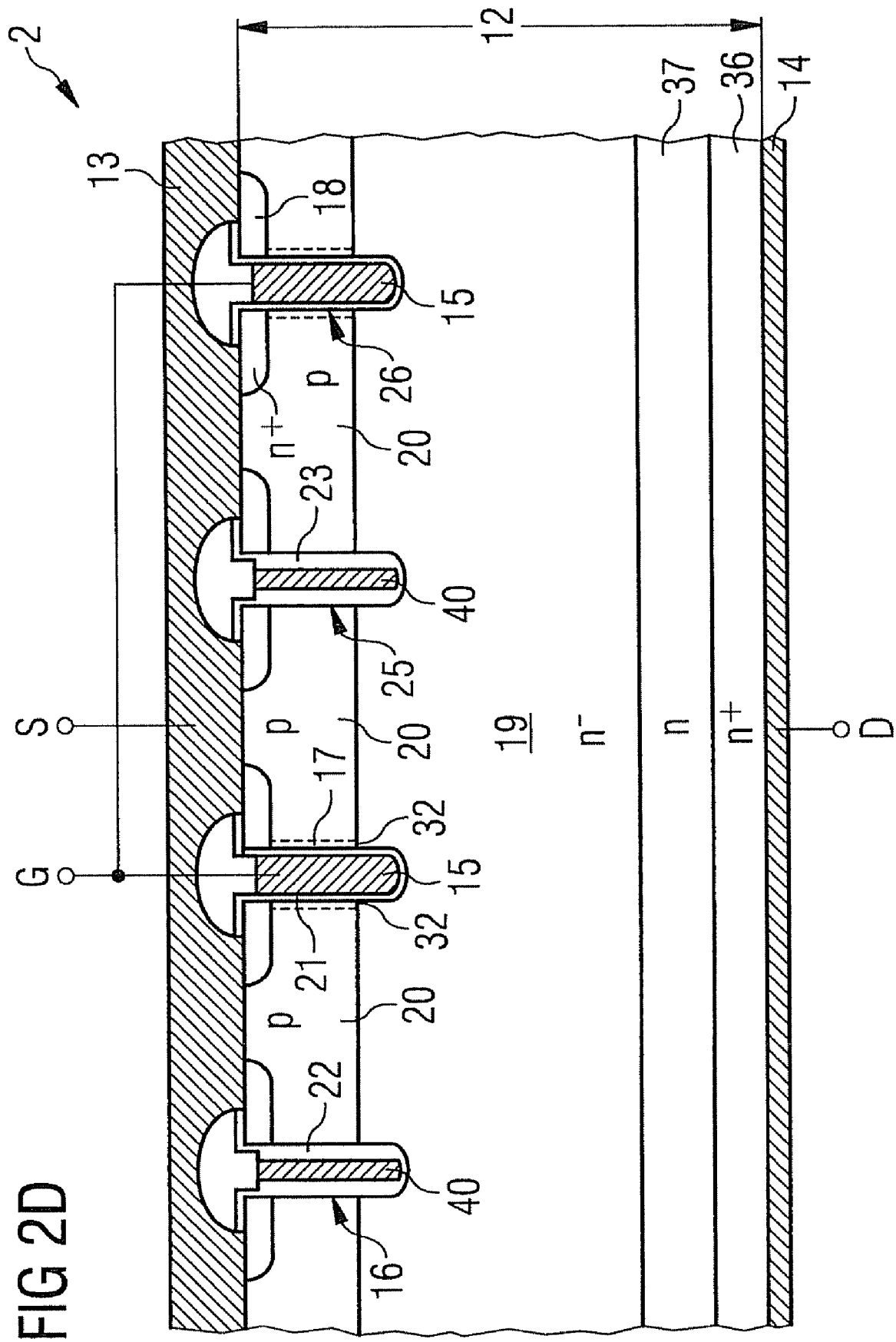

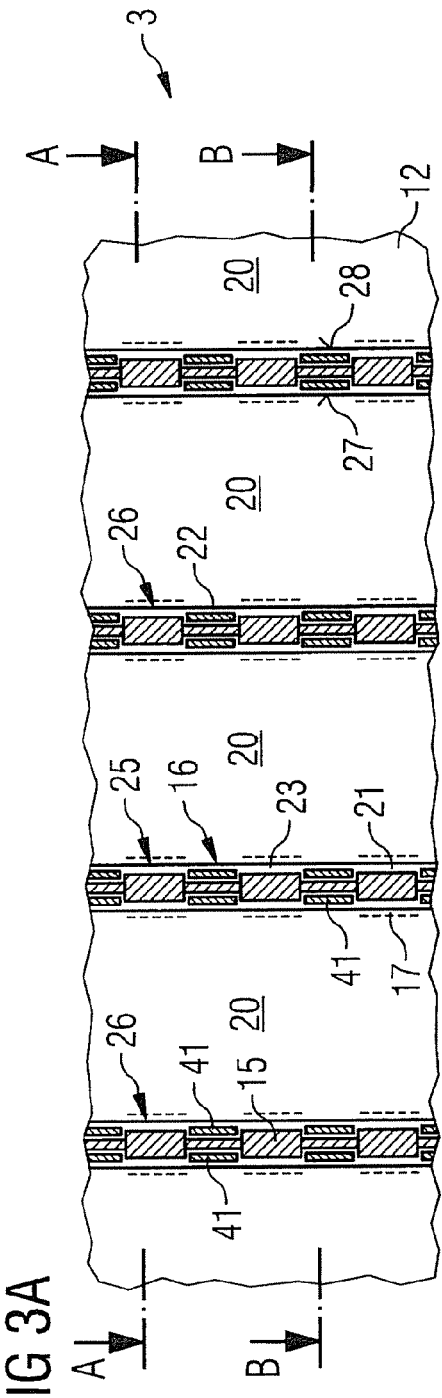
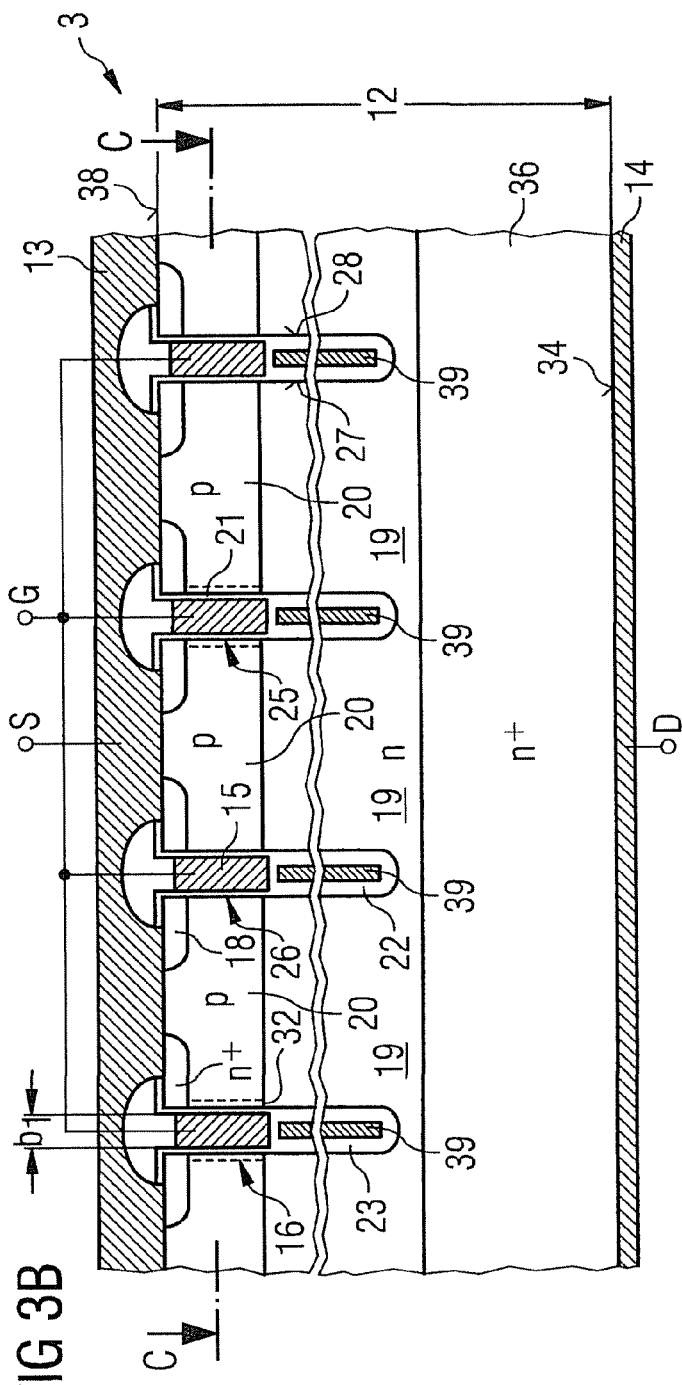
FIG 3A
FIG 3B

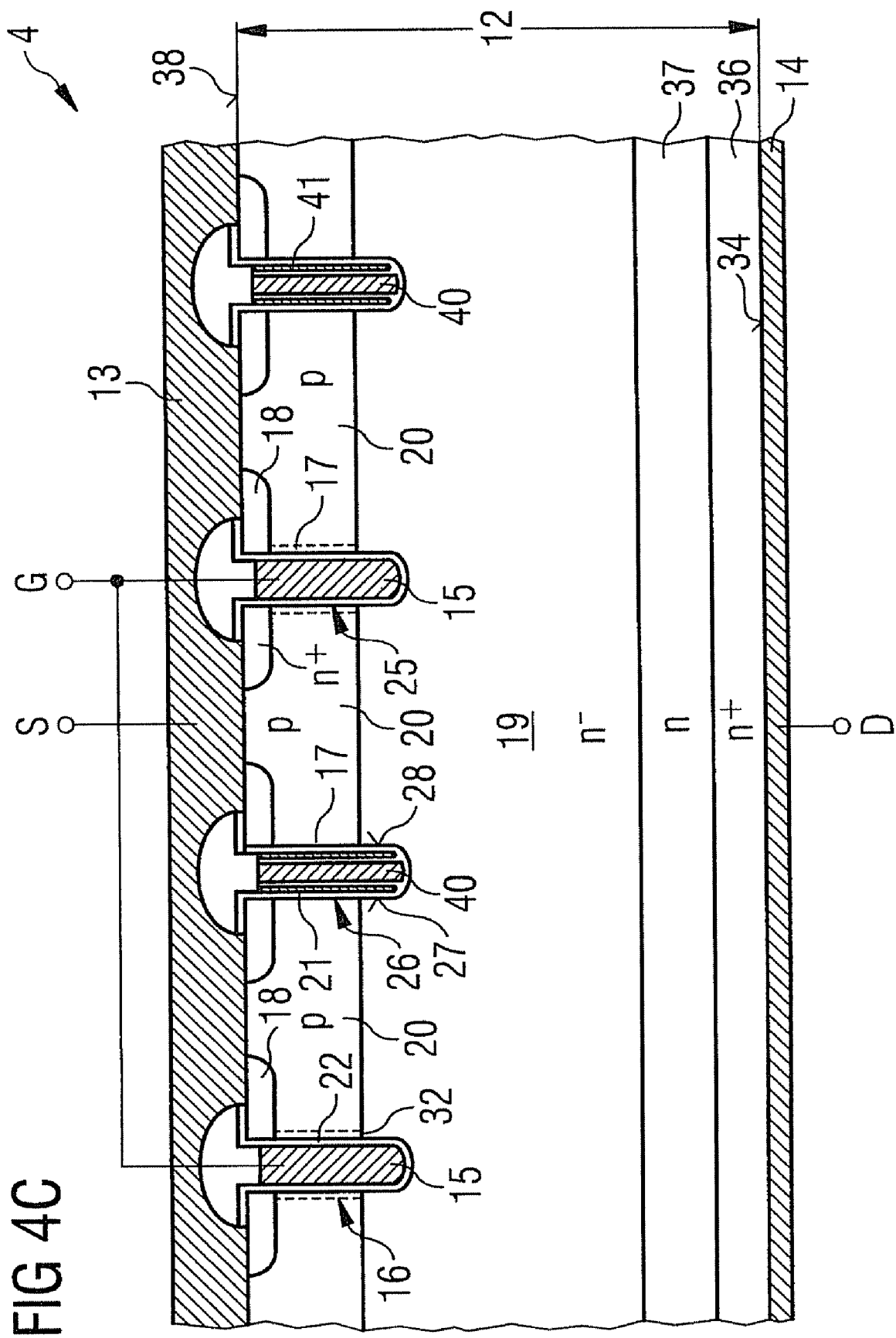

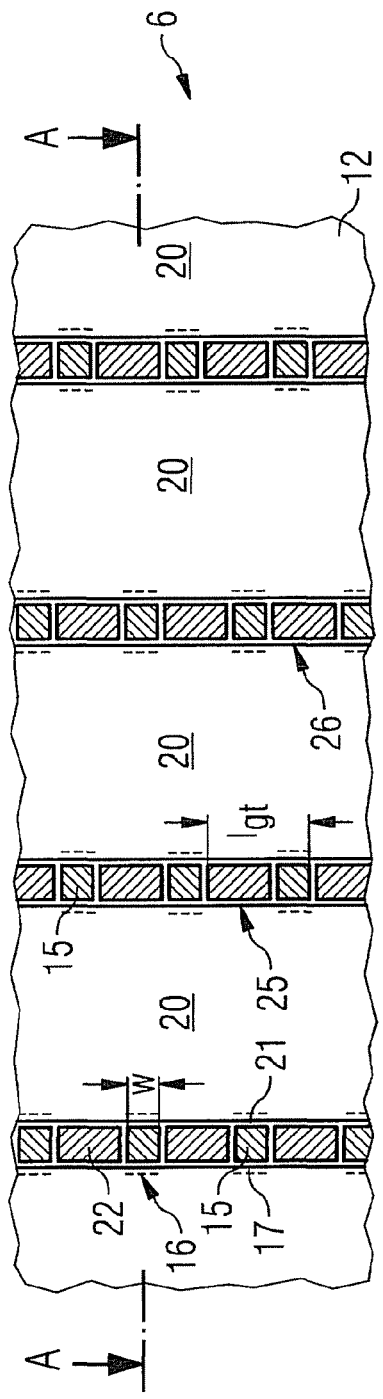
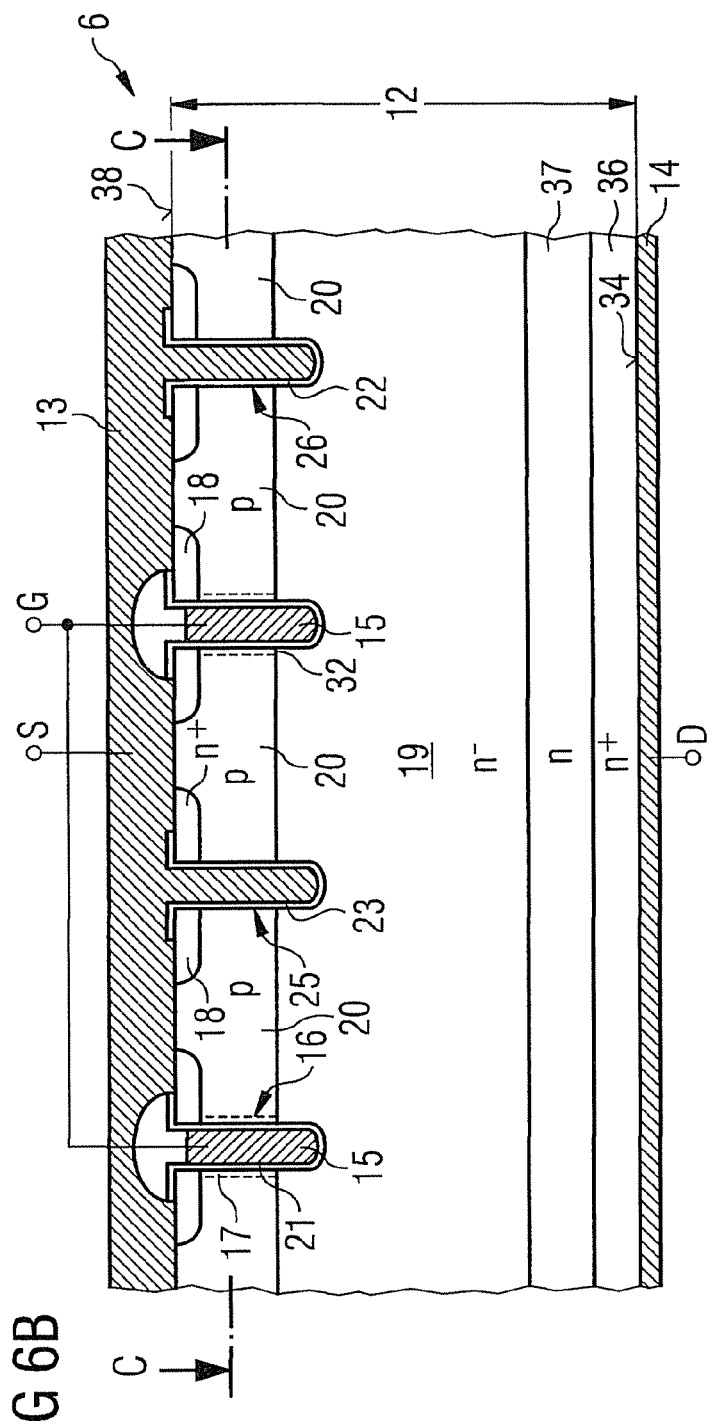
FIG 6A
FIG 6B

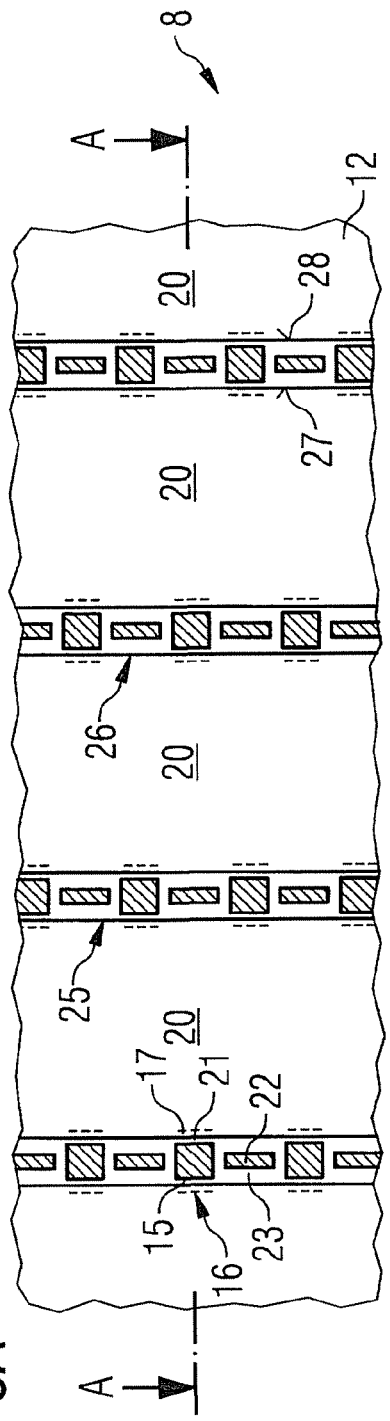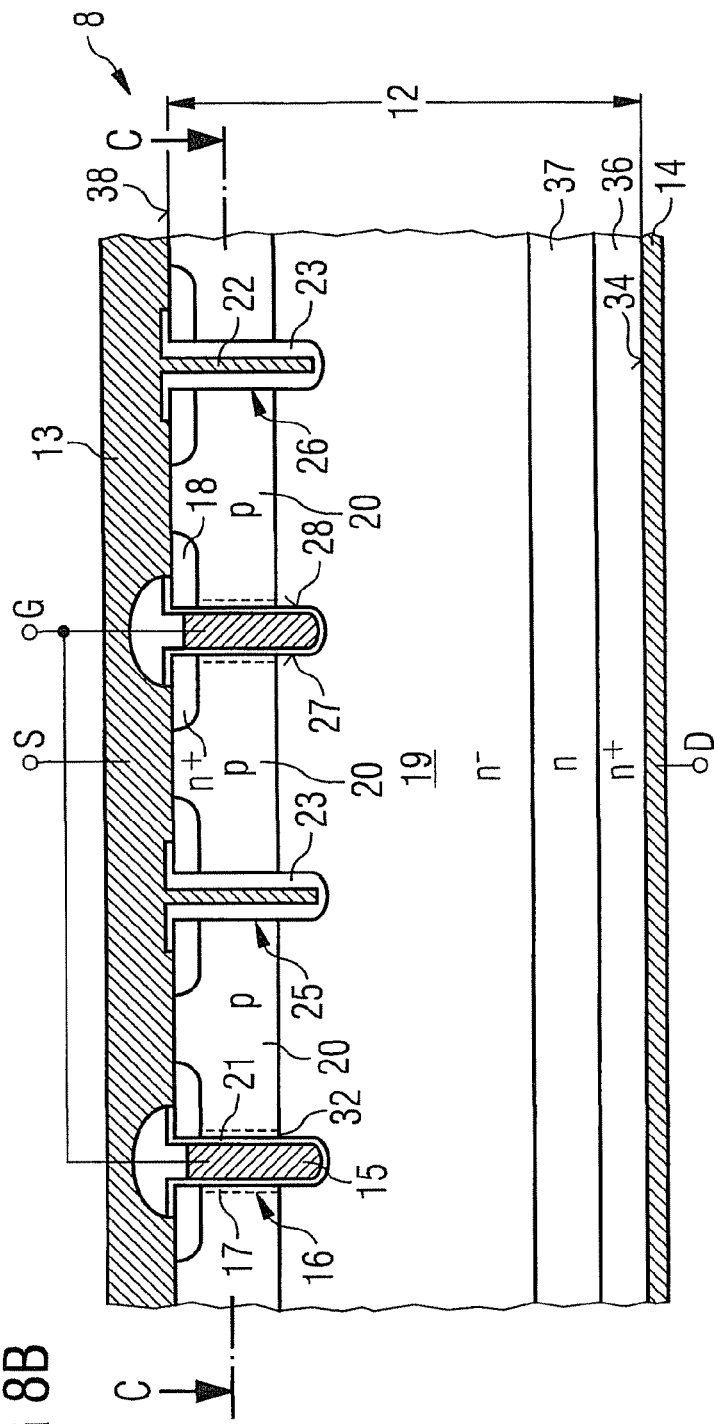
FIG 8A
FIG 8B

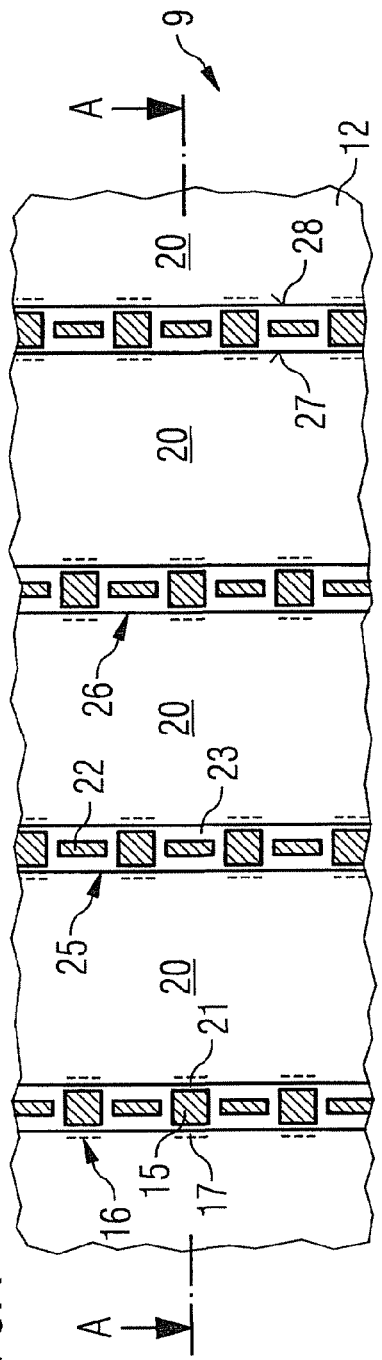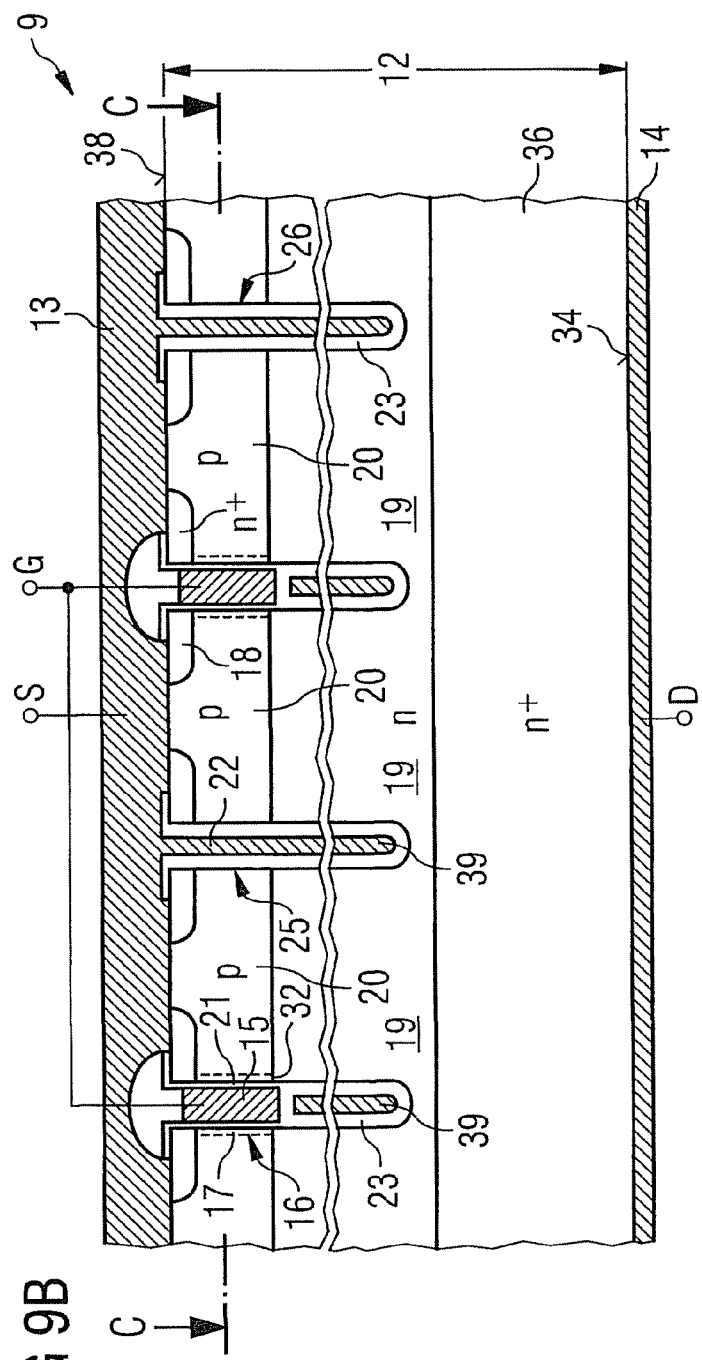
FIG 9A
FIG 9B

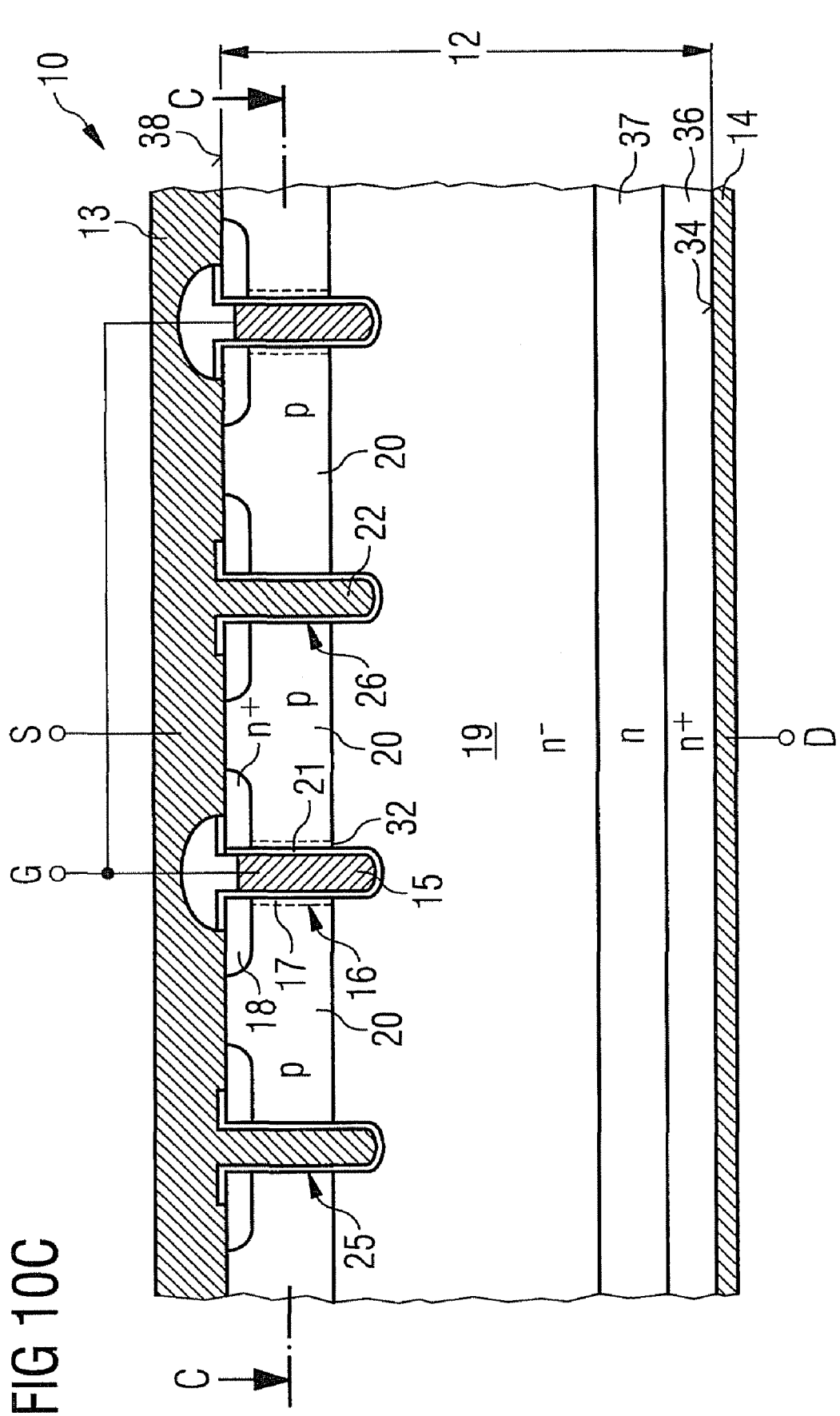

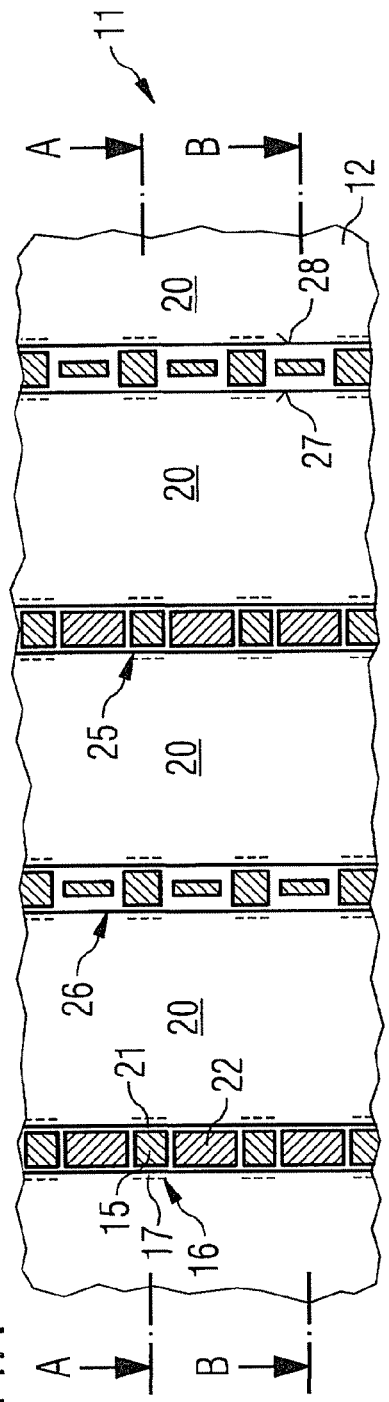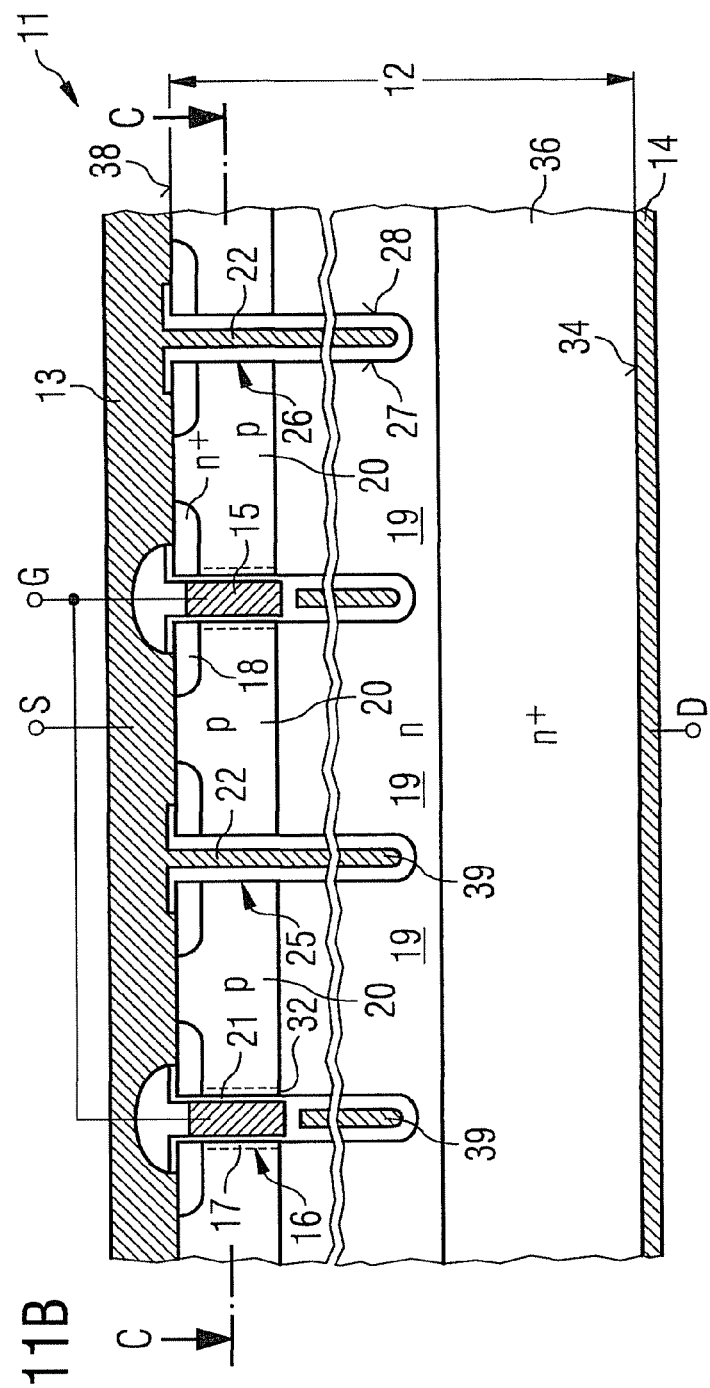
FIG 11A
FIG 11B

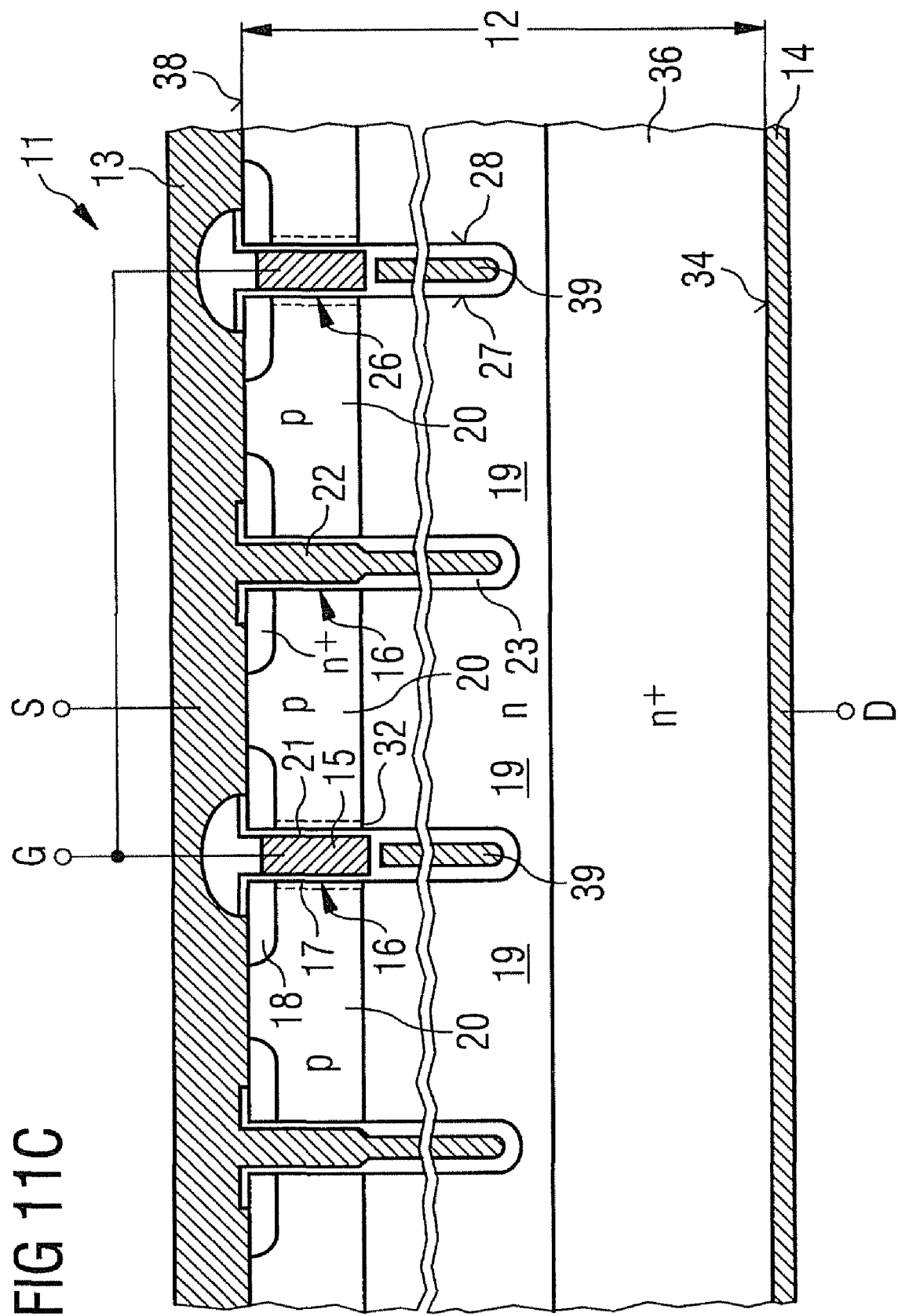

SEMICONDUCTOR DEVICE WITH A TRENCH GATE STRUCTURE AND METHOD FOR THE PRODUCTION THEREOF

BACKGROUND

The present application relates to a semiconductor device with a trench gate structure and a method for the production thereof. The semiconductor device with the trench gate structure includes a semiconductor body with two switching electrodes. A gate electrode controls the off state and the on state between the two electrodes. The gate electrode in the trench gate structure controls a vertical switching channel through the body zone.

Such semiconductor devices are built as trench power transistors or field plate trench power transistors for voltages from approximately 10V to more than 1000V. The specific channel conductivity of these devices is proportional to the channel width of the switching channels. However, the greater the channel width and thus the higher the specific channel conductivity and the lower the channel resistance become, the higher will be the gate capacitance and the gate charge related thereto, which likewise increases in proportion to the channel or gate width.

In trench power transistors or field plate trench power transistors, channel resistance becomes increasingly insignificant for voltages from approximately 50 V. In order to maintain a low gate capacitance and gate charge respectively for voltages from approximately 50 V, it is useful to maintain a small switching channel width in the context of optimizing the switching characteristics of such semiconductor devices. This however affects the on capability $R_{on} \cdot A$ in conventional trench power transistors and/or field plate trench power transistors.

In conventional semiconductor devices with a trench gate structure or a field plate trench structure, the gate electrode is located in trench strips or rectangular grids or in hexagonal grids. To reduce the gate capacitance and thus the gate charge and to minimize the channel width, the cell pitch, i.e., the step width between individual trench structures, is simply increased, thus increasing the distance between the gate trenches.

The current nevertheless has to be distributed as evenly as possible over the entire width of the drift zone between the trenches, even at increased cell pitch. If however the distance between the trenches and thus the cell pitch is increased, the distance between the channel end and the centre of each individual drift zone between two trench structures is increased as well, whereby the effective drift section resistance is increased in relation to the lateral current distribution. A sheet resistance increased by the longer distance between the trench structures, however, results in a higher $R_{on} \cdot A$. It would therefore be useful to create a semiconductor device in which the gate charge and thus the gate capacitance can be reduced without increasing the cell pitch or the distance between the trench structures respectively.

For these and other reasons there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 1A to 1D illustrate diagrammatic sectional views of a semiconductor device.

FIGS. 2A to 2D illustrate diagrammatic sectional views of a semiconductor device.

FIGS. 3A to 3C illustrate diagrammatic sectional views of a semiconductor device.

FIGS. 4A to 4C illustrate diagrammatic sectional views of a semiconductor device.

FIGS. 6A and 6B illustrate diagrammatic sectional views of a semiconductor device.

FIGS. 8A and 8B illustrate diagrammatic sectional views of a semiconductor device.

FIGS. 9A and 9B illustrate diagrammatic sectional views of a semiconductor device.

FIGS. 10A to 10C illustrate diagrammatic sectional views of a semiconductor device.

FIGS. 11A to 11C illustrate diagrammatic sectional views of a semiconductor device.

DETAILED DESCRIPTION

Figure 3C:
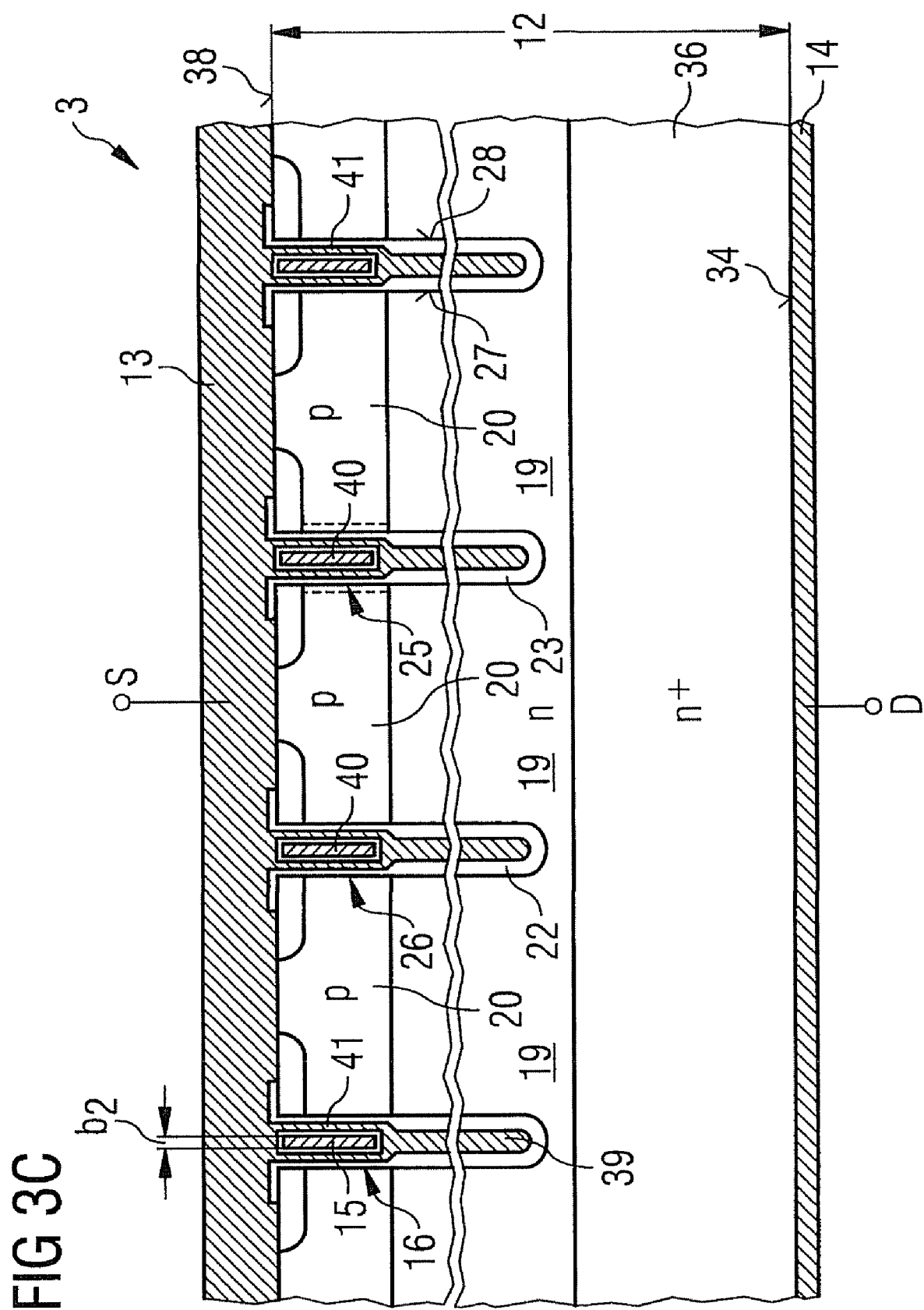

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIGS. 1A to 1D illustrate diagrammatic sectional views of one embodiment of a semiconductor device 1. FIG. 1A illustrates a horizontal section through a section of the semiconductor device 1 along line C-C from FIG. 1C. FIG. 1B illustrates an enlarged section F from FIG. 1A. FIG. 1C illustrates a vertical cross-section through the section of the semiconductor device 1 according to FIG. 1A along line A-A. FIG. 1D illustrates a vertical diagrammatic cross-section through the section of the semiconductor device 1 from FIG. 1A along line B-B.

The horizontal sectional view of FIG. 1A runs through body zones 20, which are arranged in strips and separated by strip-shaped parallel trenches 26 with a trench gate structure 16. As an alternative, the trench gate structure 16 may include trenches 26 arranged in grids or lattices or having a polygonal, in particular hexagonal, shape. The gate oxide thickness d1, as illustrated in FIG. 1B, is modulated along the trench strips 25 or a trench grid such that sections of a gate oxide thickness d1 alternate on a left-hand trench wall 27 with sections of a trench oxide thickness d2 as illustrated in FIG. 1B, which is more than the gate oxide thickness d1, along the trench strips 25 or the trench grids. As FIG. 1B illustrates, the sections of a gate oxide thickness d1 alternate accordingly with thicker trench oxide sections d2 on the right-hand side 28 of the trench.

In this embodiment, the channel width w illustrated in FIG. 1B for the formation of switching channels 17 along the trench strips 25 is halved owing to the equal lengths of gate oxide sections 21 and trench oxide sections 22 as illustrated in FIG. 1A without having to double the cell pitch. In contrast, the original cell pitch can be maintained. Any doubling of the cell pitch in order to halve the channel width w would have the result that only every other trench strip 25 as illustrated in FIGS. 1A to 1D would be available, which would adversely increase the sheet resistance or "spreading resistance" of the drift zones, one disadvantage avoided in this embodiment.

By reducing the channel width w, the gate charge is reduced as well without having to increase the spacing of the trench strips 25. The "spreading resistance" and the drift section resistance are therefore increased less than in earlier designs. In one embodiment, the length $l_{gt}$ of a gate oxide section 21 and an adjacent trench oxide section 22 is no more than double the distance d between two adjacent trenches 26, each in respect to the centre 29 of the adjacent trenches 26. In one optimum configuration, the length $l_{gt}$ of a gate oxide section 21 and an adjacent trench oxide section 22 is identical to the distance d between two adjacent trenches 26, each in respect to the centre 29 of the adjacent trenches 26. A particularly advantageous aspect of this embodiment is that the gate oxide sections 21 with the switching channels are offset relative to one another in adjacent trenches 26 of the trench gate structure 16, so that a gate oxide section 21 of one trench 26 is arranged opposite a trench oxide section 22 of an adjacent trench 26 and regions with a fully formed channel are distributed as evenly as possible along the drift zones 19. In addition, in this embodiment the gate oxide sections 21 for any one trench strip 25 are alternately arranged towards the left-hand trench wall 27 and to the right-hand trench wall 28, so that the fully formed channel sections are offset relative to the left-hand and right-hand trench walls 27 and 28 respectively, which results in an even more uniform distribution of the current paths in the drift zone.

FIG. 1B illustrates an enlarged section F from FIG. 1A. The gate electrode 15 is configured such that in any one section a full switching channel can form on one side while on the opposite side of the same section, owing to the greater oxide thickness $d_2$ in the trench oxide section 22, either no or a comparatively high-impedance channel forms and only a low gate charge can accumulate. In relation to the centre 29 of the trench structure 26, these sections are offset relative to one another and extend along the trench strips 25.

The vertical cross-section through the section of the semiconductor device 1 as illustrated along the plane A-A in FIG. 1A, which is illustrated in FIG. 1C, illustrates that this semiconductor device includes a semiconductor body 12 with a switching electrode 14 designed as a drain D in the illustrated embodiment on its underside 34. The switching electrode 14 is adjoined by a highly doped n$^+$-type region, which may be either a semiconductor substrate or the remains of a thinly ground semiconductor substrate.

This highly doped n$^+$-type drain zone 36 merges into a less highly doped field stop zone 37, which is adjoined by a lightly doped n$^-$-type drift zone 19 towards the front side 38 of the semiconductor body 12. In the vicinity of the front side 38, a p-type body zone 20 extends through the cell field, wherein a vertical switching channel 17 can form between a near-surface highly doped n$^+$-type source zone 18 and the lightly doped n$^-$-type drift zone 19 if a suitable voltage is applied to a trench gate electrode 15.

In one embodiment, the channel width w of the switching channel 17 is reduced by providing that gate oxide sections 21 in this sectional view along line A-A from FIG. 1A are provided on the right-hand trench wall 28 only. On the left-hand trench wall 27, a thicker trench oxide 23 impedes or prevents the formation of a channel. The gate electrodes 15 illustrated here together form a gate and are routed to the front side 38 outside the first switching electrode 13 representing the source S of the semiconductor device 1.

In FIGS. 1A to 1D, the formation of a switching channel 17 in the body zone 20 is indicated by broken lines. At its end 32, the switching channel 17 reaches the drift zone 19, wherein the current is expected to spread as evenly as possible in the horizontal direction in the on state. This is ensured by providing that cross-sectional patterns as illustrated in FIG. 1C alternate with cross-sectional patterns as illustrated in FIG. 1D along a trench strip 25.

FIG. 1D is a vertical diagrammatic sectional view of the semiconductor device 1 along line B-B in FIG. 1A. Components of identical function as in the preceding figures are identified by the same reference numbers and not explained again. This sectional view differs from FIG. 1C in that, in this section of the trench strips 25, switching channels 17 form on the left-hand trench wall 27 of the body zone if a suitable potential is applied, while there is no channel formation along the trench wall 28 owing to the thicker trench oxide 23.

The modulation of the oxide width for the gate electrode 15 of the trench gate structure 16 therefore allows the reduction of the gate charge while maintaining a preset cell pitch. Instead of the trench gate structure illustrated here, this reduction of the channel width can also be applied to field plate trench structures, wherein field plate regions 39 as indicated by dot-dash lines in FIG. 1D can be disposed below the gate electrodes 15; these may extend into the semiconductor body in the direction of a vertical end of the drift zone 19. In this context, it is further possible to connect the field plate regions 39 electrically to the gate electrodes 15.

FIGS. 2A to 2D are diagrammatic sectional views of a semiconductor device 2. FIG. 2A is once again a horizontal sectional view through a body zone 20 along line C-C in FIG. 2C. In this embodiment, the gate charge is reduced by providing that the trench structures 26 in the form of trench strips 25 as illustrated in FIG. 2A divide the body zone into individual cells and that elongated gate electrodes 15 in the trench gate structure 16 have modulated widths $b_1$ and $b_2$. This is explained in detail with reference to the section F illustrated in FIG. 2B within a circular line.

While the cross-section of the electrode relative to the trench centre 29 is asymmetrical in FIG. 1, the sectional view of the gate electrode 15 in one embodiment according to FIG. 2B illustrates a symmetrical configuration relative to the trench centre 29. The channel width w and thereby the gate charge are reduced by modifying the width b of the gate electrode 15 in sections between a width $b_1$ and a width $b_2$ symmetrical to the trench centre. While in the sections with the width $b_1$ towards the trench walls 27 and 28 a gate oxide 21 is provided between the trench wall 27 or 28 respectively and the gate electrode 15, a trench oxide 23 thicker than the gate oxide 21 is provided in the sections 22 on both sides of the gate electrode 15 in sections of the smaller electrode width $b_2$.

As a result, no channel is formed in the body zone 20 in this section 22, if a suitable gate voltage is applied. In order to obtain nevertheless a relatively even distribution of current density in the drift zone 19 located below the body zone as illustrated in FIG. 2C between the ends 32 of the switching channels 17, the channel-forming sections 21 are offset relative to one another from one trench strip 25 to another trench strip 25. This results in two different cross-sectional patterns as illustrated in FIGS. 2C and 2D. While in the sectional view of FIG. 2C channel-containing gate electrode sections 15 alternate with electric connecting sections 40 of the gate electrode, this sequence is reversed in FIG. 2D, the sectional view along plane B-B in FIG. 2A.

FIGS. 3A to 3C are diagrammatic sectional views of a semiconductor device 3. In one embodiment, the sections 22 with trench oxide, which do not form any channels, are used to install field plates in the form of conductive electrodes 41, which are electrically connected to one of the switching electrodes and to which source potential in particular can be applied; they therefore provide an additional screen and completely block the formation of a channel. At the same time, these electrodes 41 in the trench oxide sections 22 may be connected to field plates 39 located underneath the trench gate structure 16, whereby a transistor with field plate trenches is implemented. Between the gate electrode sections 15 and the electrodes 41, an additional gate-source capacitance is created, so that the gate-source capacitance is reduced only if the oxide between the gate electrode sections 15 and the electrodes 41 is thinner than the oxide in the gate oxide sections 21. The gate-drain capacitance is however reduced significantly by the screening action of the electrodes 41 at source potential, so that the switching losses are reduced to the greatest degree in this embodiment, while the driver power requirements are reduced less if at all.

FIG. 3A is once again a horizontal section through the base zone 20 of the semiconductor device 3, wherein the contour of the gate electrode resembles the one illustrated in FIG. 2, but in this embodiment the sections 21 of the gate electrode 15 which form a channel 15 are located directly opposite one another in two adjacent trench strips 25.

FIG. 3B is a diagrammatic vertical sectional view along line A-A in FIG. 3A. While gate sections forming a channel 17 and having a width b1 are arranged opposite one another in the base zone 20 of a cell, field plate regions 39 are provided below the trench gate structure in the drift zone 19 of each cell. Such field plate regions 39 may be floating or electrically connected to the source S as illustrated in FIG. 3C.

FIG. 3C is a diagrammatic sectional view along line B-B in FIG. 3A. The screening electrodes 41 illustrated in FIG. 3A in the section 22 of the trench oxide 23 provide for an electric connection to the first switching electrode 13 and thus to the source S, so that the field plate regions 39 in the drift zone 19 below the trench gate structures 16 are at source potential. The section of the gate electrode 15 with the reduced width $b_2$ is now used only for a connection between the sections 21 of the gate electrode 15 which form a channel 17.

Figure 4A:
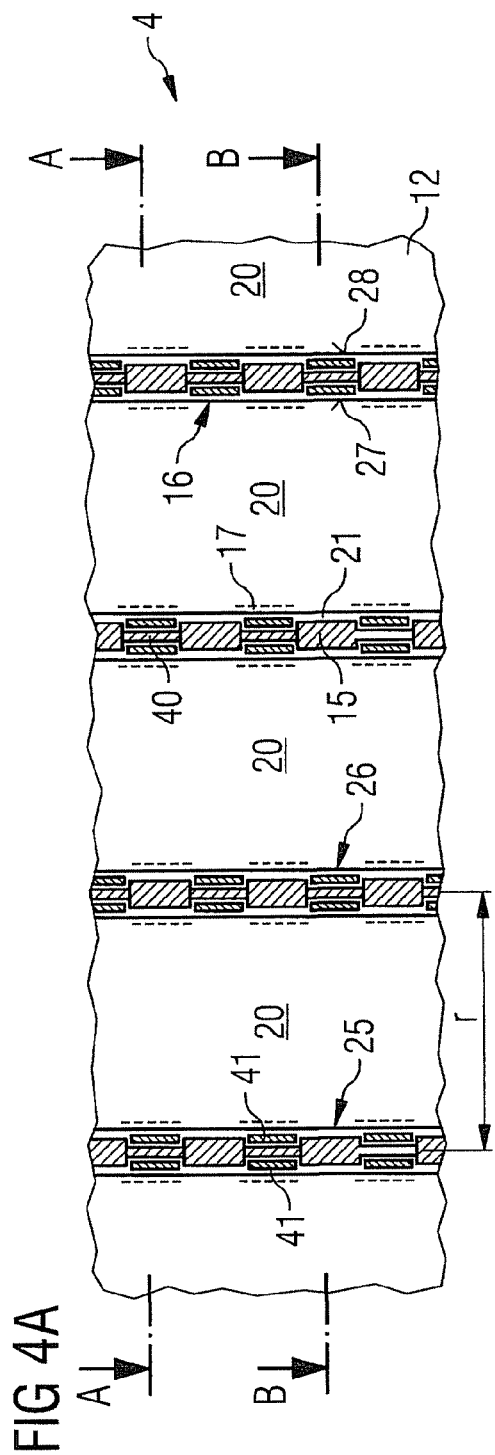
Figure 4B:
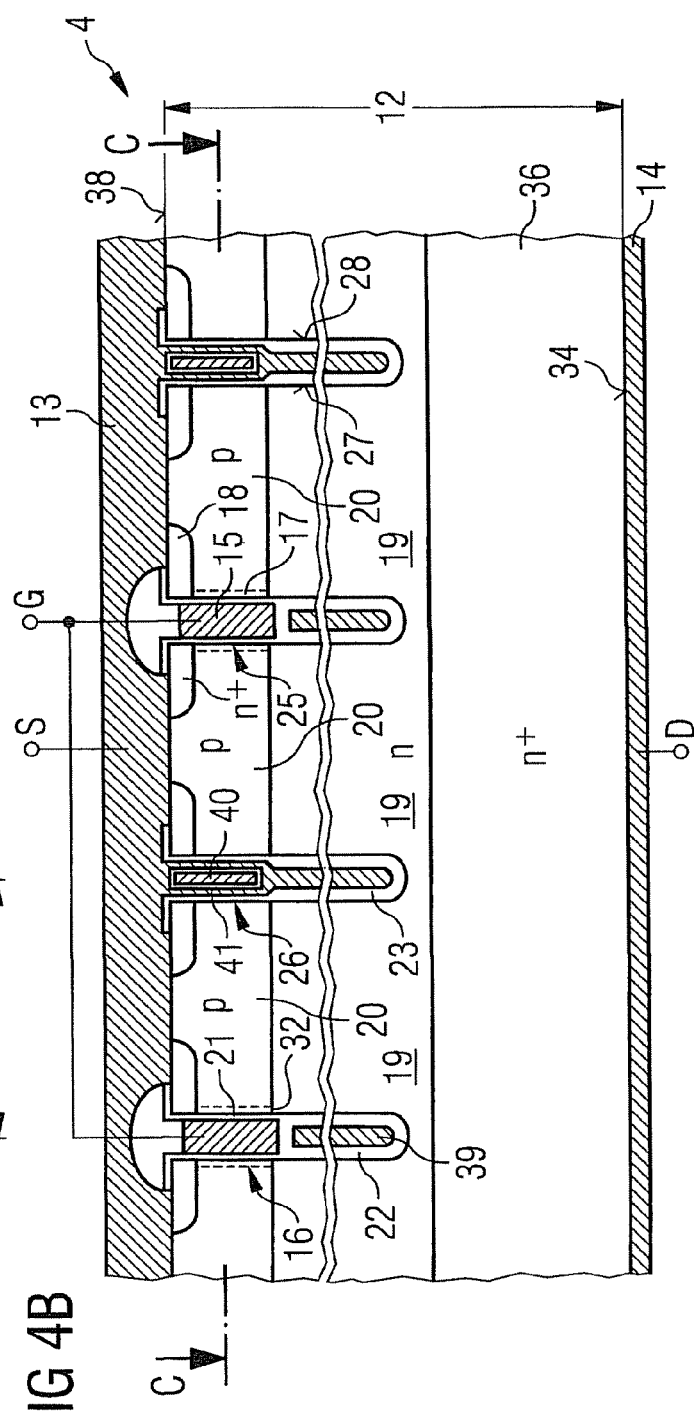

FIGS. 4A to 4C are diagrammatic sectional views of one embodiment of a semiconductor device 4. FIG. 4A is a horizontal cross-section through the body zone 20 of the semiconductor device 4 along line C-C in FIGS. 4B and 4C. This horizontal sectional view differs from that of FIG. 3A in that the sections of two adjacent trench strips 25 which form a channel 17 are no longer arranged opposite one another, but offset relative to one another. This offset provides for a more uniform current flow in the drift zone.

FIG. 4B is a diagrammatic vertical sectional view along line A-A in FIG. 4A. As a result of the offset arrangement of the sections forming a channel 17, gate electrode sections 21 alternate in this sectional view with connecting sections 40 of the gate electrode 15. In this semiconductor device 4, the drift zone 19 is likewise subdivided by field plate regions 39 connected to the first switching electrode 13 on the front side 38 of the semiconductor body 12 by connecting or screening electrodes 41.

FIG. 4C is a diagrammatic vertical sectional view of a modification of a semicon-ductor device 4 along line A-A in FIG. 4A. Components of identical function as in the preceding figures are identified by the same reference numbers and not explained again. This sectional view differs from FIG. 4B in that there are no field plates in the drift zone 19 and in that the screening electrodes 41 are not connected to the first switching electrode 13 on the front side 38 of the semiconductor body 12 and are therefore floating.

Figure 5A:
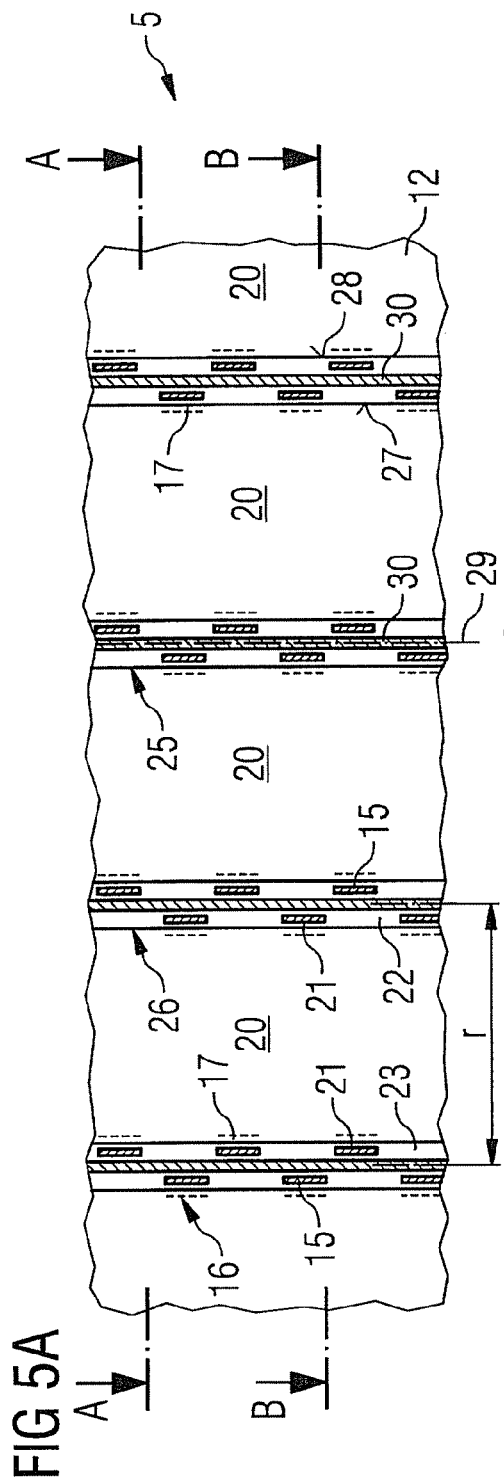
FIGS. 5A to 5C illustrate diagrammatic sectional views of a semiconductor device.
Figure 5B:
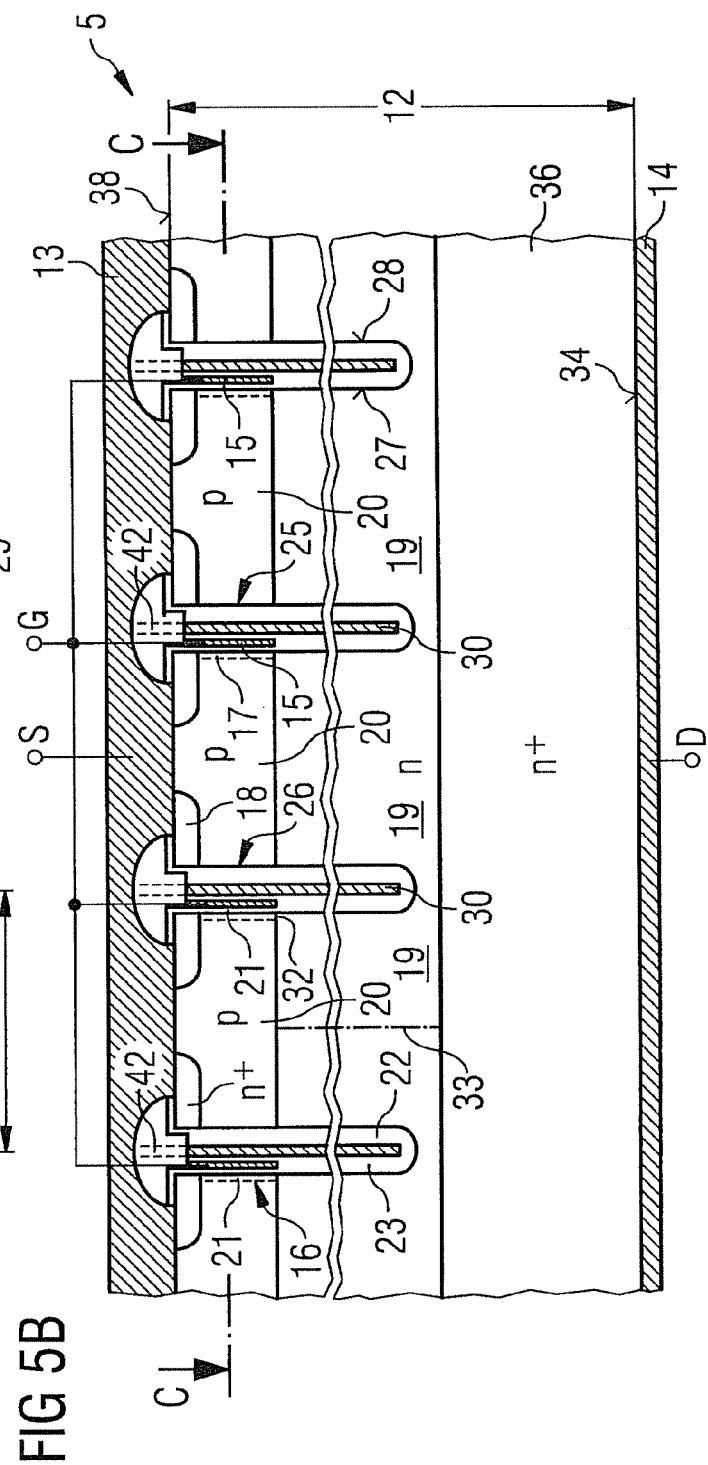
Figure 5C:
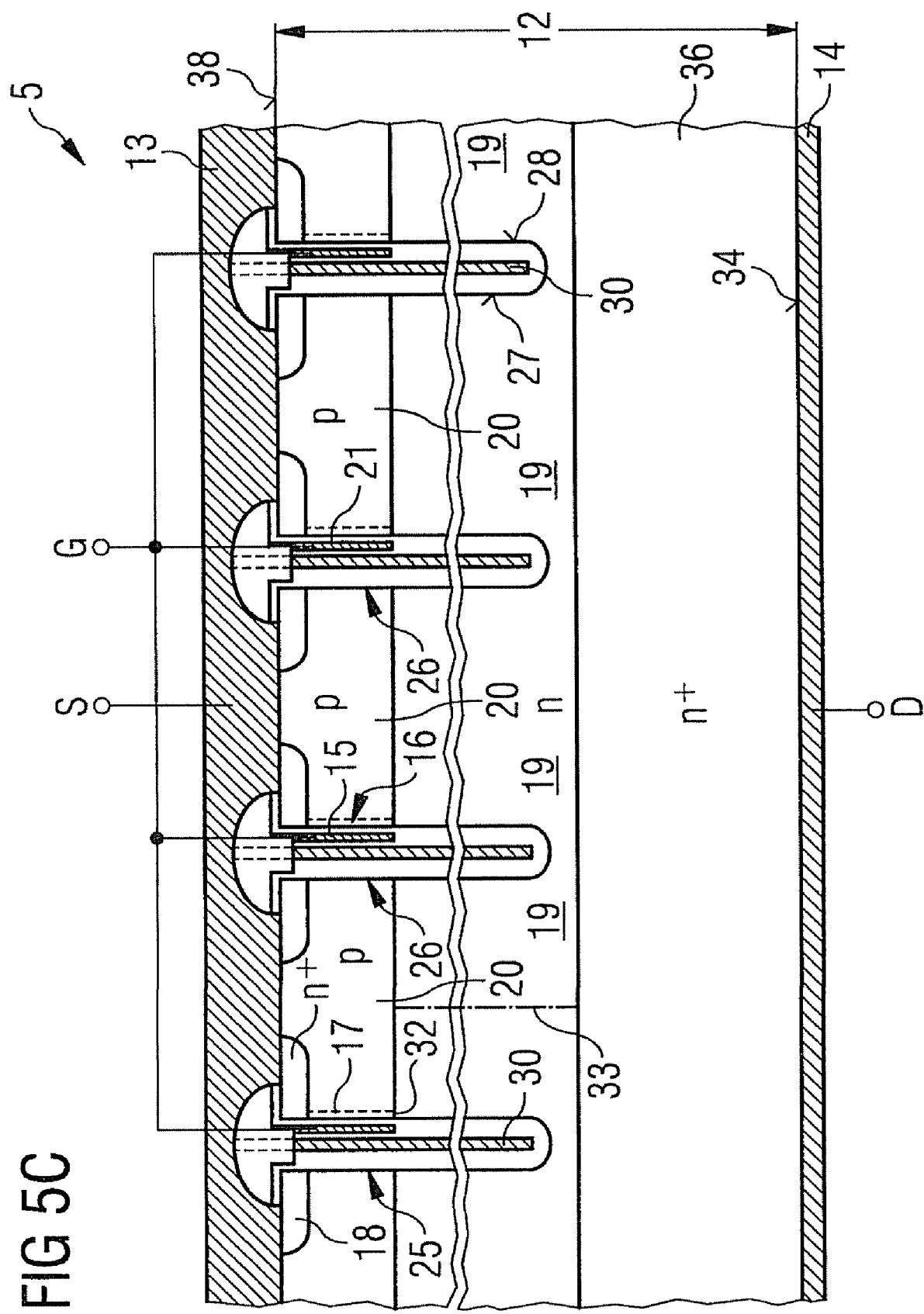

FIGS. 5A to 5C are diagrammatic sectional views of one embodiment of a semiconductor device 5. FIG. 5A is once again a horizontal cross-section through the body zone 20 of the semiconductor device 5, the body zone 20 being subdivided into cells with a cell pitch r by suitable trench strips 25.

In one embodiment, the trench strip 25 does not contain a centrally located gate electrode. In place of this, a central field plate 30 insulated on both sides against the surrounding semiconductor body by a trench oxide 23 is provided in the trench centre 29. In the body zone 20, gate electrode sections 15 insulated towards the trench walls 27 and 28 by a gate oxide section 21 are provided within the trench oxide 23. These gate oxide sections 15 allow the formation of a channel 17 through the body zone 20, the channel width being once again reduced owing to the gate electrode sections 15 distributed along the trench strip 25.

FIG. 5B is a diagrammatic vertical sectional view along line A-A in FIG. 5A. This sectional view illustrates that the central field plates 30 are at source potential, which is indicated by the broken lines 42. In this vertical sectional view according to FIG. 5B, the gate electrode sections 15 are close to the left-hand trench wall 27, while the thicker trench oxide 23 is located on the right-hand trench wall 28. By using such a central field plate 30, the level of doping material in the drift zone 19 can be increased, so that the drift zone 19 can now be considered to be an n-type zone and the on resistance $R_{on} \cdot A$ of the semiconductor device 5 is reduced. This also applies to the semiconductor devices 3 and 4 of FIGS. 3 and 4.

FIG. 5C is a vertical sectional view along line B-B in FIG. 5A. This differs from the sectional view according to FIG. 5B in that gate electrode sections 15 forming a channel 17 are now located in the region of the right-hand trench wall 28. The gate electrode sections 15 forming a channel 17 are therefore offset relative to one another in adjacent trench strips 25. The gate electrodes 15 together form a gate and are routed to the front side 38 outside the first switching electrode 13 representing the source S of the semiconductor device 5. In principle, the channel width can be reduced as required, but FIGS. 1 to 5 illustrate that it is approximately halved in these embodiments. Smaller channel widths are achieved in the embodiments described below.

FIGS. 6A and 6B are diagrammatic sectional views of one embodiment of a semiconductor device 6. FIG. 6A is a horizontal cross-section through a body zone 20 of the semiconductor device 6 along line C-C in FIG. 6B. In this embodiment, gate electrode sections 15 alternate within a trench strip 25 with sections 22 at source potential. The sections 22 at source potential are longer than the gate electrode sections 15, reducing the channel width to approximately one third. This embodiment differs from those described above in that the trench oxide sections are located in sections 22 of the trench gate structure 16 where the gate electrode 15 is interrupted.

By varying the length ratios between the sections 22 at source potential and the gate sections 15 within a trench strip 25, the channel width w of the switching channel 17 and thus the charges to be shifted on the gate electrode can be reduced as required. As the gate capacitance is reduced at the same time, the cut-off frequencies of such semiconductor devices shift towards even higher potential switching frequencies, in particular as, at the same time as the gate capacitance, the feedback capacitance and the output capacitance related thereto are reduced as well.

The channel width w of the switching channel 17 can be reduced until it is equal to or less than half the length $l_{gt}$ of a gate oxide section 21 and an adjacent trench oxide section 22. As a result, the cut-off frequency of such a semiconductor device 6 can be shifted towards higher switching frequencies.

In another embodiment, the channel width w of the switching channel 17 can be reduced to a quarter or less of the length $l_{gt}$ of a gate oxide section 21 and an adjacent trench oxide section 22. As a result, the cut-off frequency of such a semiconductor device 6 can be shifted towards even higher switching frequencies than above.

Moreover, the channel width w of the switching channel 17 can be reduced to a tenth or less of the length $l_{gt}$ of a gate oxide section 21 and an adjacent trench oxide section 22. As a result, the cut-off frequency of such a semiconductor device 6 can be shifted towards even higher switching frequencies than in the two cases described above.

FIG. 6B is a diagrammatic vertical sectional view through the semiconductor device 6 along line A-A in FIG. 6A. Gate electrode sections 15 forming channels 17 alternate with sections 22 at source potential. Even the sections 22 at source potential have a relatively thin insulation approximately corresponding to the gate oxide thickness to insulate this source potential against the potential in the body zone. This relatively small oxide thickness is however sufficient, as the field strength and the voltage differential are minimal in this body zone region.

Significantly higher field strengths build up in the drift zone, so that a field plate at source potential has to be surrounded by a correspondingly thicker trench oxide as illustrated in FIG. 7.

Figure 7A:
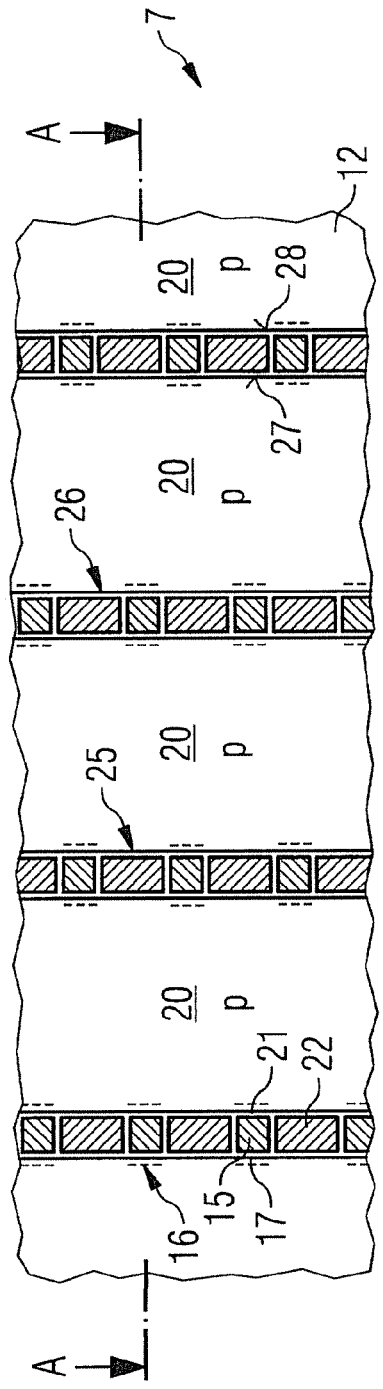
FIGS. 7A and 7B illustrate diagrammatic sectional views of a semiconductor device.
Figure 7B:
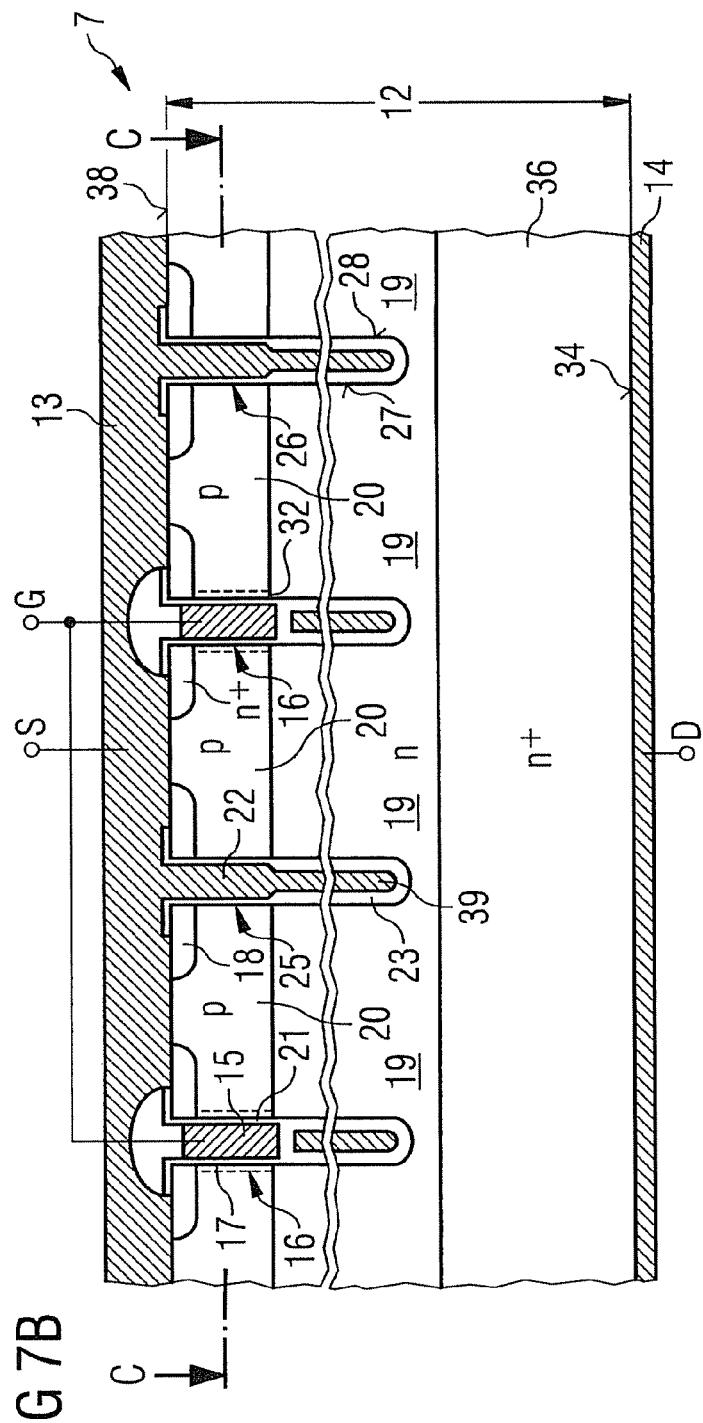

FIGS. 7A and 7B are diagrammatic sectional views of one embodiment of a semiconductor device 7. Components of identical function as in the preceding figures are identified by the same reference numbers and not explained again. While the horizontal sectional view of FIG. 7A along plane C-C in FIG. 7B does not differ from the horizontal sectional view of FIG. 6A, the vertical sectional view of FIG. 7B illustrates a clear change, with field plate regions 39 being provided below the trench gate structure 16. These field plate regions 39 are connected to source potential in the sections 22, so that all field plate regions 39 in the drift zone 19 are at source potential. In order to insulate the field plate regions 39 in the drift zone 19 against the high field strength prevailing there, the trench oxide 23 is noticeably thicker than the gate oxide 21 in the gate electrode sections 15.

FIGS. 8A and 8B are diagrammatic sectional views of one embodiment of a semiconductor device 8. The horizontal sectional view of FIG. 8A through a body zone 20 of the semiconductor device 8 along line C-C in FIG. 8B differs from the horizontal sectional view of the embodiments described above in that gate electrode sections 15 alternate with sections 22 at source potential within a trench strip 25. However, the sections 22 at source potential are surrounded by the thicker trench oxide 23 in the body zone region as well, while this is as thick as or less thick than the gate oxide 21 in FIG. 7A. This is also confirmed by the vertical sectional view of FIG. 8B along line A-A in FIG. 8A, which illustrates that a section connected to source potential is surrounded by a thicker trench oxide 23 throughout. Like the gate electrode section 15, this section 22 can be made of a conductive material, for example from the group including polysilicon, amorphous silicon and/or metal.

FIGS. 9A and 9B are diagrammatic sectional views of one embodiment of a semiconductor device 9. The horizontal sectional view of FIG. 9A through the body zone 20 of the semiconductor device 9 does not differ from the horizontal sectional view known from FIG. 8A. The diagrammatic vertical sectional view of FIG. 9B along line A-A in FIG. 9A illustrates that, in addition to the structure illustrated in FIG. 8B, field plate regions 39 are provided in the drift zone 19, which, surrounded by the sections 22, are electrically connected to the first switching electrode 13 and therefore at the potential of the source S. The gate electrode sections G are routed to the front side 38 of the semiconductor body 12 outside the first switching electrode 13 and outside the plane of the drawing.

Figure 10A:
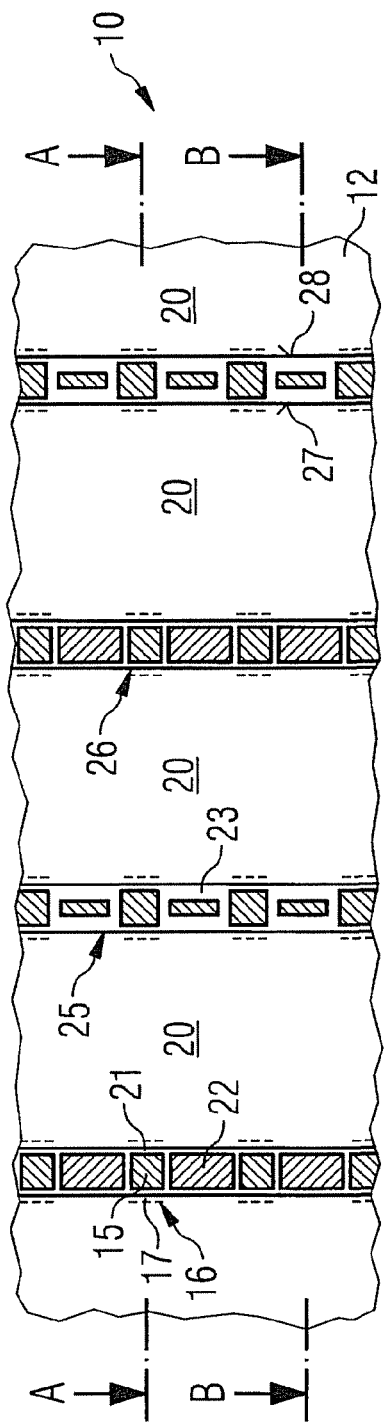
Figure 10B:
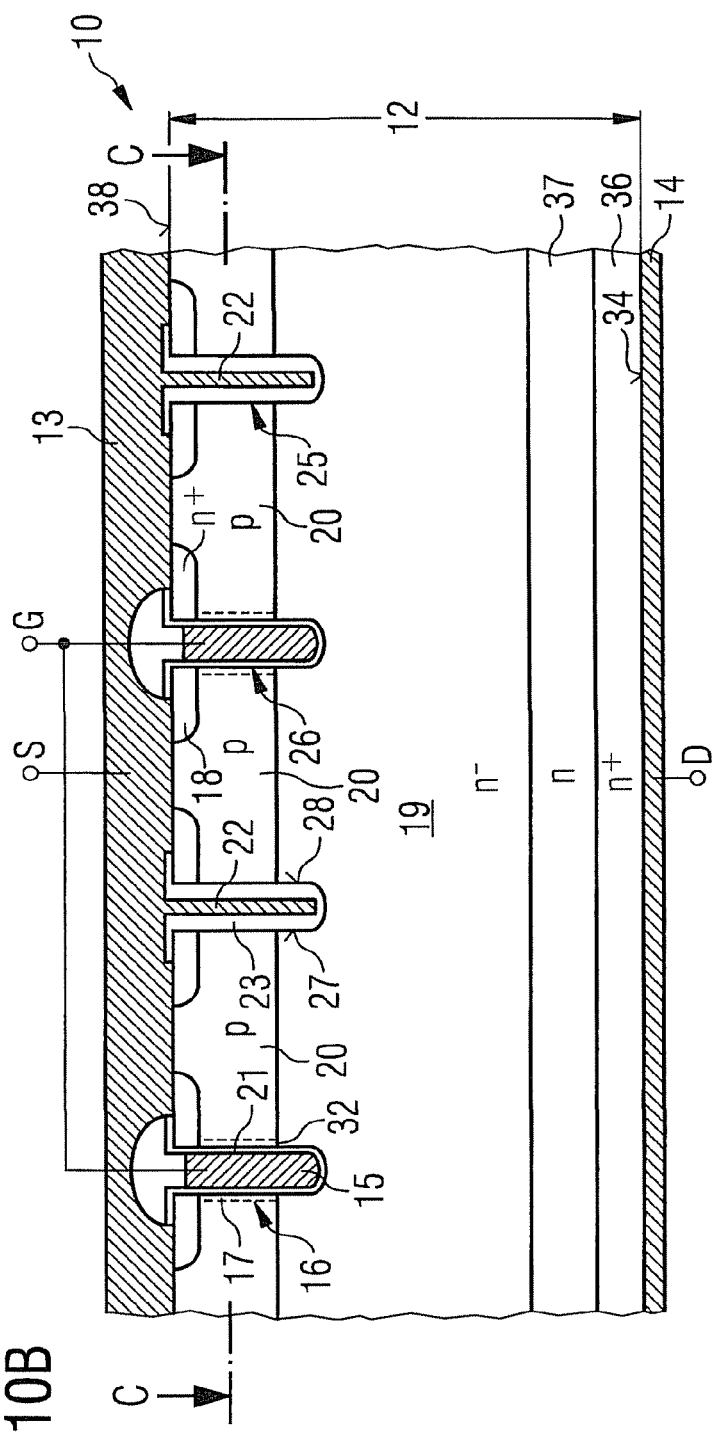

FIGS. 10A to 10C are diagrammatic sectional views of one embodiment of a semiconductor device 10. In principle, the horizontal sectional view of FIG. 10A through a body zone 20 of the semiconductor device 10 is a combination of the horizontal sectional views of FIGS. 8A and 9A. Trench strips 25 with wider sections alternate with those with narrower sections. However, both the narrower and the wider sections 22 are connected to source potential in the region of the body zone 20 as illustrated in FIGS. 10B and 10C.

FIG. 10B is a vertical sectional view along line A-A in FIG. 10A. In this sectional view, gate electrode sections 15 alternate with narrow source-connected regions 22 in the body zone region 20. FIG. 10C is a vertical sectional view along line B-B in FIG. 10A, where noticeably wider sections connected to source potential alternate with gate electrode sections 15 from one trench strip 25 to another trench strip 25.

FIGS. 11A to 11C are diagrammatic sectional views of one embodiment of a semiconductor device 11. The horizontal sectional view through the body zone 20 of the semiconductor device 11 corresponds to the horizontal sectional view through the body zone 20 of the semiconductor device 10 as illustrated in FIG. 10A. The difference lies in the vertical sectional views, where field plate regions 39 are provided below the trench gate electrodes in the drift zone 19 as illustrated in FIGS. 11B and 11C. As a result, the concentration of doping material in the drift zone 19 can be increased significantly compared to the semiconductor device illustrated in FIG. 10. In the vertical sectional view of FIG. 11B along line A-A in FIG. 11A, the field plate regions 39 are electrically connected to the first electrode 13 via a narrow section 22 in the body zone region, while in FIG. 11C this connection is obtained via a noticeably wider section in the region of the body zone within the trench strips 25.

The above embodiments can be used both for n- and p-channel transistors and for bipolar devices such as IGBTs (insulated gate bipolar transistors) or MCTs (MOS-controlled thyristors), and its applicability is not limited to these types of semiconductor devices.

To produce such semiconductor devices 1 to 11, a method is used which, following the completion of a trench structure with trench walls and trench bases, includes the following processes. A first insulating layer is initially applied to the trench walls and trench bases; this layer is thicker than a gate dielectric and is for example made of a silicon oxide or silicon nitride. Sections of the trench walls 26 and 27 are then etched, and a gate dielectric noticeably thinner than the first insulating layer and for example made of an oxide or a nitride is applied to the exposed sections. As an alternative, a gate dielectric and a trench oxide of different thickness can be obtained by first applying a gate oxide to the trench walls and bases and then covering this with a dielectric layer, for example a nitride layer, sections of which are then removed, whereupon a trench oxide thicker than the dielectric is applied by thermal oxidation in the sections which are not covered. The trench structure is then filled with a gate electrode, the width of which is modulated in sections by the varying thickness of the insulation.

The semiconductor device can then be provided with first and second switching electrodes and with a trench gate structure using known production methods and processes. In this production, conventional processes can be used to a large extent; only mask sets differing from earlier mask sets have to be used in modulating the gate electrode. Following this, the trench structure can be produced using the processes described below.

In one embodiment, a semiconductor wafer is first produced with a front-side first layer of a first conduction type made of drift zone material and a back-side layer doped more highly than the drift zone material. From the front side, a second layer of a second conduction type complementing the first conduction type is then introduced near the surface as a body zone material less deeply than the first layer. Finally highly doped $n^+$-type source zones with an impurity concentration higher than that of the drift zone material and less depth than the second layer are created by the masked and selective introduction of near-surface highly doped zones of a third layer of the first conduction type into the body zone material.

Following the preparation of a semiconductor wafer, a masked and selective introduction of trench structures with trench walls and bases can be carried out, which are located in the region of the highly doped zones and penetrate at least the third and second layers in the etching process, the trench bases extending into the first layer. Depending on the depth to which the trench bases extend in the first layer, trench gate structures and/or field plate trenches can be installed into the trench structures.

CVD or PVC processes can be used to apply a first insulating layer thicker than a gate dielectric to the trench walls and bases. A first insulating layer thicker than a gate dielectric can also be applied to the trench walls and bases by thermal oxidation of the trench walls and bases respectively. Sections of the trench walls and bases are simultaneously exposed by using isotopic reactive ion etching in a plasma or by using wet chemical etching.

A gate dielectric is applied to the exposed sections by using thermal oxidation, which enables precise and thin gate oxide layers to be produced on the exposed sections of the trench walls. The trench structure can be filled with a gate electrode with sections of modulated width by using depositing electrically conductive body silicon, amorphous silicon or metals.

By using a suitable multi-phase treatment of the trench structure, further field plate structures can be produced at least in sections of the trench structure in the region of the body zones in addition to the trench gate structures, the field plate structures being provided below and adjacent to or in place of the trench gate structures as provided for in the above embodiments. For this purpose, a first dielectric of a different, greater thickness than the gate oxide is applied to the trench walls. This is structured in its height by using an auxiliary layer prior to the deposition of the field plate material or by using the field plate material itself. The gate oxide is then applied. The field plate material can then be applied so thinly that only regions with thick oxide are filled, while regions with thin oxide are only coated. After sections of field plate material have been removed, the gate oxide may be removed and fresh gate oxide may be formed, whereupon the gate electrode is installed.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
    a semiconductor body with two switching electrodes;
    at least one gate electrode, wherein the at least one gate electrode controls the off state and the on state between the switching electrodes;
    a trench gate structure by which the at least one gate electrode controls at least one vertical switching channel through at least one body zone; and
    wherein the trench gate structure includes at least one trench with side walls and wherein the at least one trench accommodates the at least one gate electrode, which is insulated in the region of the at least one body zone against the side walls alternately by at least one gate oxide section and at least one trench oxide section, and which forms a switching channel with a gate oxide section in the at least one region.

2. The semiconductor device of claim 1, wherein the switching channel is formed only in the at least one region with a gate oxide section.

3. The semiconductor device of claim 1, wherein the at least one trench oxide section is located in a section of the trench gate structure where the at least one gate electrode is reduced in its width.

4. The semiconductor device of claim 1, wherein the at least one trench oxide section is located in a section of the trench gate structure where the at least one gate electrode is interrupted.

5. The semiconductor device of claim 1, wherein a field plate is provided in the at least one trench oxide section.

6. The semiconductor device of claim 5, wherein the field plate is electrically connected to one of the switching electrodes.

7. The semiconductor device of claim 5, wherein the field plate is floatingly coupled to the surrounding semiconductor body.

8. The semiconductor device of claim 1, wherein the at least one gate electrode is located between two trench walls and the gate electrode sections are alternately located towards a left-hand trench wall and a right-hand trench wall.

9. The semiconductor device of claim 1, wherein the semiconductor device has a trench structure with a central vertical field plate in the centre of the at least one trench and gate electrode sections are arranged in the at least one trench to the left and to the right of the central field plate.

10. The semiconductor device of claim 1, wherein a first field plate is provided in the at least one trench oxide section, and wherein a second field plate extending in the direction of a vertical end of a drift zone and electrically connected to the first field plate is provided below the gate electrode.

11. The semiconductor device of claim 1, wherein the at least one vertical switching channel is provided between a near-surface zone of a first conduction type and a drift zone of the same conduction type in the semiconductor body, and wherein the at least one body zone has a conduction type complementing the first conduction type.

12. A semiconductor device comprising:
a semiconductor body with switching electrodes;
a gate electrode, wherein the at least one gate electrode controls the off state and the on state between the switching electrodes;
a trench gate structure by which the at least one gate electrode controls at least one vertical switching channel through at least one body zone; and
wherein the trench gate structure includes at least one trench with side walls and wherein the at least one trench accommodates the at least one gate electrode, which is insulated in the region of the at least one body zone against the side walls alternately by at least one gate oxide section and at least one trench oxide section, and which forms a switching channel with a gate oxide section in the at least one region,
wherein the trench gate structure includes strip-shaped parallel trenches.

13. The semiconductor device of claim 12, wherein the gate oxide sections are offset relative to one another in adjacent trenches of the trench gate structure, so that a gate oxide section of one trench is disposed opposite a trench oxide section of an adjacent trench.

14. The semiconductor device of claim 12, wherein there is the following relationship between the length $l_{gt}$ of a gate oxide section and an adjacent trench oxide section and the distance d between two adjacent trenches: $l_{gt} \leq 2 \cdot d$.

15. The semiconductor device of claim 12, wherein there is the following relationship between the length $l_{gt}$ of a gate oxide section and an adjacent trench oxide section and the distance d between two adjacent trenches: $l_{gt} = d$.

16. A method for the production of a semiconductor device with a trench gate structure, comprising:
following completing a trench structure with trench walls and trench bases, applying a first insulating layer thicker than a gate dielectric to the trench walls and trench bases;
etching sections of the trench walls and trench bases and applying a gate dielectric to the exposed sections;
filling the trench structure with a gate electrode, sections of which are modulated in their width by the varying insulation thickness so as to form alternating gate oxide and trench oxide sections between the gate electrode and trench walls along a length of the trench, the trench oxide sections being thicker than the gate oxide sections;
completing the semiconductor device with first and second switching electrodes and a trench gate structure.

17. A semiconductor device comprising:
a semiconductor body with switching electrodes;
a gate electrode, wherein the gate electrode controls the off state and the on state between the switching electrodes;
a trench gate structure by which the gate electrode controls a vertical switching channel through a body zone; and
wherein the trench gate structure includes a trench with side walls and wherein the trench accommodates the gate electrode, insulated in the region of the body zone against the side walls alternately by a gate oxide section and a trench oxide section, and which forms a switching channel with a gate oxide section in the at least one region.

18. The semiconductor device of claim 17, wherein a field plate extending into the semiconductor body in the direction of a vertical end of a drift zone is provided below the gate electrode.

19. The semiconductor device of claim 18, wherein the field plate is electrically connected to the at least one gate electrode.

20. The semiconductor device of claim 17, wherein there is the following relationship between the width w of the switching channel and the length $l_{gt}$ of a gate oxide section and an adjacent trench oxide section: $w \leq 0.5 \cdot l_{gt}$.

21. The semiconductor device of claim 17, wherein there is the following relationship between the width w of the switching channel and the length $l_{gt}$ of a gate oxide section and an adjacent trench oxide section: $w \leq 0.1 \cdot l_{gt}$.

22. The semiconductor device of claim 1, wherein a thickness between the at least one gate electrode and the side wall of the trench is greater in that at least one transistor oxide siction than in the at least one gate oxide section.

23. The semiconductor device of claim 1, wherein the at least one gate oxide section forms a vertical switching channel, and wherein the at least one trench oxide does not form a vertical switching channel.

* * * * *